United States Patent
Fulford et al.

(10) Patent No.: US 12,218,195 B2
(45) Date of Patent: Feb. 4, 2025

(54) VERTICAL SEMICONDUCTOR DEVICE IN NARROW SLOTS WITHIN TRENCH

(71) Applicant: Tokyo Electron Limited, Tokyo (JP)

(72) Inventors: H. Jim Fulford, Albany, NY (US); Mark I. Gardner, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 468 days.

(21) Appl. No.: 17/545,887

(22) Filed: Dec. 8, 2021

(65) Prior Publication Data
US 2023/0178599 A1   Jun. 8, 2023

(51) Int. Cl.
*H01L 29/06* (2006.01)
*H01L 21/8234* (2006.01)
*H01L 29/66* (2006.01)
*H01L 29/786* (2006.01)

(52) U.S. Cl.
CPC .. *H01L 29/0665* (2013.01); *H01L 21/823418* (2013.01); *H01L 21/823468* (2013.01); *H01L 29/6656* (2013.01); *H01L 29/78618* (2013.01)

(58) Field of Classification Search
CPC ....... H01L 21/28141; H01L 21/823418; H01L 21/823487; H01L 21/823468; H01L 21/823885; H01L 29/0653; H01L 29/0665; H01L 29/0676; H01L 29/1037; H01L 29/6653; H01L 29/66553; H01L 29/6656; H01L 29/66666; H01L 29/7827; H01L 29/78642; H01L 29/7788; H01L 29/78618
See application file for complete search history.

(56) References Cited

U.S. PATENT DOCUMENTS

| | | | |
|---|---|---|---|
| 9,024,376 B2 | 5/2015 | Masuoka et al. | |
| 9,425,324 B2 | 8/2016 | Diaz et al. | |
| 9,478,624 B2 | 10/2016 | Colinge et al. | |
| 9,530,700 B1* | 12/2016 | Mallela | H01L 27/0924 |
| 2014/0332919 A1* | 11/2014 | Guan | H01L 29/0634 257/487 |
| 2019/0371678 A1* | 12/2019 | Song | H01L 21/31053 |

* cited by examiner

*Primary Examiner* — David C Spalla
(74) *Attorney, Agent, or Firm* — Foley & Lardner LLP

(57) ABSTRACT

Disclosed herein are related to a device including vertically placed semiconductor devices in a trench, and a method of fabricating the vertically placed semiconductor devices. In one aspect, a device includes a substrate including a trench defined by a first sidewall and a second sidewall facing each other along a first direction, and a floor between one end of the first sidewall and one end of the second sidewall. The device may include two or more vertical slots separated by vertical nano sheets extending upwards from the floor within the trench. In one aspect, the semiconductor devices can be formed in the two or more vertical slots. For example, source/drain structures, gate structures, and additional source/drain structures of vertical transistors can be formed in the two or more vertical slots.

20 Claims, 44 Drawing Sheets

VERTICAL SEMICONDUCTOR DEVICE IN NARROW SLOTS WITHIN TRENCH

TECHNICAL FIELD

The present disclosure relates generally to the field of manufacturing semiconductor devices.

BACKGROUND

In the manufacture of semiconductor devices, various fabrication processes are executed, such as film-forming depositions, etch mask creation, patterning, material etching and removal, and doping treatments. These processes may be performed to form semiconductor device components on a substrate. Some example fabrication techniques allow the manufacture of transistors on a single active device plane, while wiring or metallization is formed above the active device plane. Such devices are accordingly characterized as two-dimensional (2D) circuits, manufactured using 2D fabrication techniques. Although scaling efforts have greatly increased the number of transistors per unit area in 2D circuits, these 2D fabrication techniques are approaching physical atomic limitations with single digit nanometer semiconductor device fabrication nodes.

SUMMARY

To overcome physical limitations experienced by 2D semiconductor circuits, three-dimensional (3D) stacking that utilizes vertically spaced nano sheets and processes for growing such nano sheets may be utilized. The nano sheets may vertical epi nano sheets that are vertically spaced from one another, and may be co-integrated with horizontal nano sheets and other device elements. In forming the devices, 3D channel lengths and spacer regions may be controlled since deposition processing may be utilized.

3D integration, e.g., a stacking (or vertical arrangement) of multiple semiconductor devices (e.g., transistor structures), aims to overcome scaling limitations experienced in planar devices by increasing transistor density in volume rather than area.

One embodiment of a formation process can include forming a trench in a substrate. The trench can be defined by a first sidewall and a second sidewall facing each other along a first direction (e.g., X-direction). The method can include forming a first epitaxial layer on the first sidewall along a second direction (e.g., Z-direction) traversing the first direction. The method can include forming a second epitaxial layer on the second sidewall along the second direction, where the first epitaxial layer and the second epitaxial layer can be a first type. The method can include forming a third epitaxial layer on the first epitaxial layer along the second direction. The method can include forming a fourth epitaxial layer on the second epitaxial layer along the second direction, where the third epitaxial layer and the fourth epitaxial layer can be a second type.

The trench can be defined by a floor between one end of the first sidewall and one end of the second sidewall. The method can include forming a dielectric layer on the floor.

The first epitaxial layer, the second epitaxial layer, the third epitaxial layer, and the fourth epitaxial layer can extend from the dielectric layer along the second direction.

The first epitaxial layer and the second epitaxial layer can include SiGe, and the third epitaxial layer and the fourth epitaxial layer can include Si, SiN+, or SiP+.

The trench can be defined by a third sidewall and a fourth sidewall facing each other (e.g., Y-direction) along a third direction orthogonal to the first direction and the second direction. The method can include forming a dielectric layer on the first sidewall, the second sidewall, the third sidewall, and the fourth sidewall prior to forming the first epitaxial layer and the second epitaxial layer. The method can include removing a first portion of the dielectric layer on the first sidewall, and a second portion of the dielectric layer on the second sidewall.

In some implementations, removing the first portion of the dielectric layer on the first sidewall, and the second portion of the dielectric layer on the second sidewall can include covering a third portion of the dielectric layer on the third sidewall, and a fourth portion of the dielectric layer on the fourth sidewall with a photoresist mask, while exposing the first portion and the second portion of the dielectric layer, and etching the first portion and the second portion of the dielectric layer.

The method can include removing portions of the first epitaxial layer, the second epitaxial layer, the third epitaxial layer, and the fourth epitaxial layer formed above a surface of the substrate. The method can include removing the first epitaxial layer.

The method can include forming a first source/drain structure between the first sidewall and the third epitaxial layer.

The method can include forming a gate dielectric region on an exposed portion of the third epitaxial layer along the second direction, after forming the first source/drain structure.

A first spacer may be formed above the first source/drain structure along the second direction between the first sidewall and the third epitaxial layer.

A gate structure may be formed above the first spacer along the second direction between the first sidewall and the third epitaxial layer. The gate dielectric region can be formed between the gate structure and the third epitaxial layer.

The method can include forming a second spacer above the gate structure along the second direction between the first sidewall and the third epitaxial layer.

The method can include removing an exposed portion of the gate dielectric region after depositing the second spacer. The method can include forming a second source/drain structure above the second spacer along the second direction between the first sidewall and the third epitaxial layer. A first end of the gate dielectric region may directly contact the first source/drain structure, and a second end of the gate dielectric region may directly contact the second source/drain structure.

The method can include forming a first set of epitaxial layers of the first type and a second set of epitaxial layers of the second type between the first sidewall and the second sidewall. Each of the second set of epitaxial layers of the second type can be interposed between two corresponding epitaxial layers of the first type. In some implementations, the method can include forming a third set of epitaxial layers of the first type and a fourth set of epitaxial layers of the second type between the first sidewall and the second sidewall. Each of the fourth set of epitaxial layers of the second type can be interposed between two corresponding epitaxial layers of the first type.

The method can include removing the first epitaxial layer, the second epitaxial layer, the first set of epitaxial layers, and the third set of epitaxial layers.

The method can include forming a divider between i) one of the first set of epitaxial layers closest to the second sidewall and ii) one of the third set of epitaxial layers closest to the first sidewall.

The device can include a substrate including a trench defined by a first sidewall and a second sidewall facing each other along a first direction (e.g., X-direction), and a floor between one end of the first sidewall and one end of the second sidewall. The device can include one or more epitaxial layers in the trench, where each of the one or more epitaxial layers can extend along a second direction (e.g., Y-direction) traversing the first direction. The first sidewall, the second sidewall, the floor of the trench, and the one or more epitaxial layers can define two or more slots within the trench. The device can include a first set of source/drain structures in the two or more slots above the floor of the trench along the second direction. The device can include a second set of source/drain structures in the two or more slots above the first set of source/drain structures along the second direction. The device can include a set of gate structures in the two or more slots, where each of the set of gate structures can be disposed between a corresponding one of the first set of source/drain structures and a corresponding one of the second set of source/drain structures.

The device can include gate dielectric regions. Each of the gate dielectric regions can be on a portion of a corresponding epitaxial layer of the one or more epitaxial layers between a corresponding one of the first set of source/drain structures and a corresponding one of the second set of source/drain structures.

The device can include a first set of spacers, where each of the first set of spacers can be disposed between a corresponding one of the first set of source/drain structures and a corresponding one of the set of gate structures. The device can include a second set of spacers, where each of the second set of spacers can be disposed between a corresponding one of the second set of source/drain structures and a corresponding one of the set of gate structures.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification. Aspects can be combined and it will be readily appreciated that features described in the context of one aspect can be combined with other aspects. Aspects can be implemented in any convenient form. As used in the specification and in the claims, the singular form of 'a', 'an', and 'the' include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of simplicity, not every component may be labeled in every drawing. In the drawings.

DETAILED DESCRIPTION

Figure 1A:
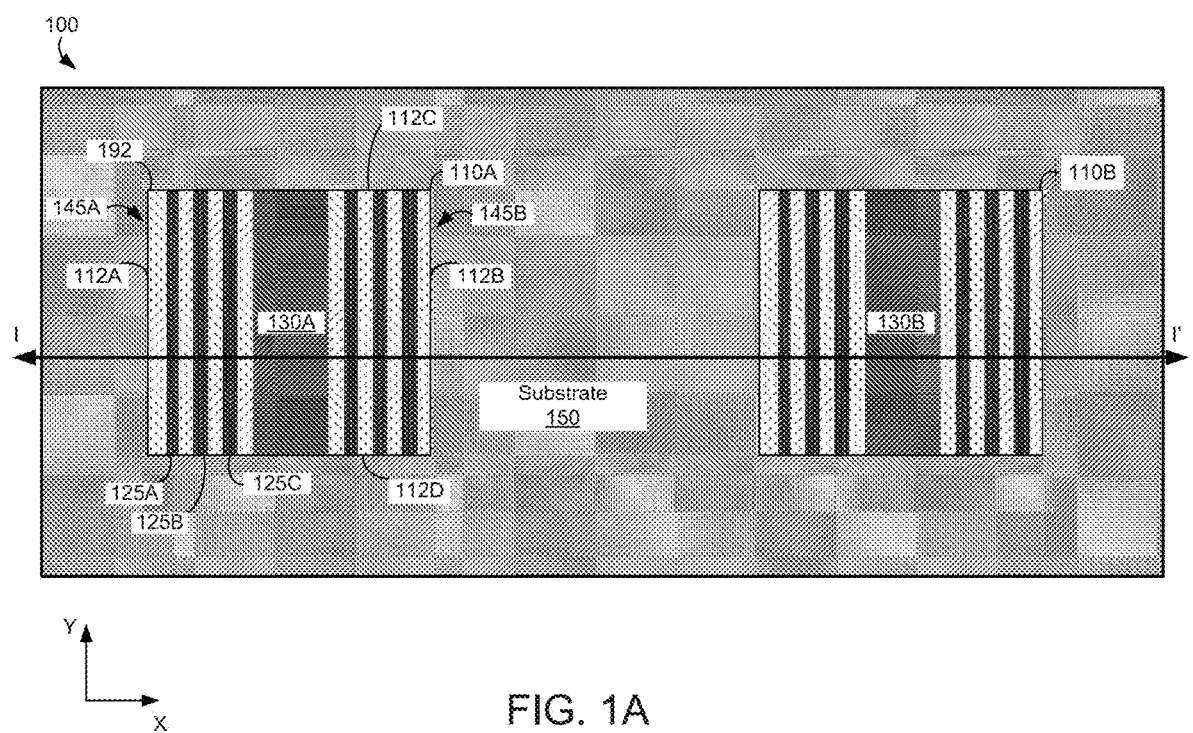
FIG. 1A is a top plan view of vertical transistors formed in trenches, according to an embodiment.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

Disclosed herein are embodiments related to a device including vertically placed semiconductor devices in a trench, and a method of fabricating the vertically placed semiconductor devices. In some embodiments, a device includes a substrate including a trench defined by a first sidewall and a second sidewall facing each other along a first direction (e.g., X-direction), and a floor between one end of the first sidewall and one end of the second sidewall. The device may include two or more vertical slots within the trench. In one aspect, the semiconductor devices can be formed in the two or more vertical slots. For example, source/drain structures, gate structures, and additional source/drain structures of vertical transistors can be formed in the two or more vertical slots.

In one approach, a process of forming the vertically placed semiconductor devices may include forming a trench within a substrate, and forming a first set of epitaxial layers extending along a second direction traversing the first direction and a second set of epitaxial layers extending along the second direction. Each of the second set of epitaxial layers may be interposed between two epitaxial layers of the first set of epitaxial layers. The process of forming the vertically placed semiconductor devices may include removing the first set of epitaxial layers to form spaces or slots within the trench, and forming components of a vertically placed semiconductor device in each slot. For example, source/drain structures, gate structures, and source/drain structures can be formed in a slot along the second direction to form a vertical transistor.

Vertically placed semiconductor devices disclosed herein can be formed in narrow slots to achieve area efficiency. In one aspect, transistor channels and spacer regions can be formed with high accuracy through deposition to achieve low part-to-part variations. The vertical transistors disclosed herein can be formed with various channel doping and/or source/drain doping techniques to allow flexibility in the fabrication process. The vertical transistors can be formed with high quality epitaxial layers to achieve saturation current (Idsat) for implementing complementary metal-oxide-semiconductor (CMOS) transistors. Source/drain structures disposed along the first direction can be connected to form a multi-finger transistor to achieve higher Idsat than Idsat achievable by a single source/drain structure.

Although some descriptions herein are provided for forming vertical transistors, general principles disclosed herein can be applied to form other vertically placed semiconductor devices (e.g., diode, resistor, capacitor, etc.).

The techniques provided herein can utilize conductive dielectric materials (sometimes referred to herein as "conductive channels"), which may have similar properties to semiconductor materials, to fabricate vertical 3D transistors. For example, certain materials, when combined with oxygen, may form new materials that exhibit semiconductor properties (e.g., it can turn "OFF" with low off-state leakage current, or can become highly conductive under certain circumstances, etc.). Some examples of N-type conductive channels include $In_2O_3$, $SnO_2$, InGaZnO, and ZnO. One example of a P-type conductive channel is SnO. Additionally or alternatively, the channel may comprise a 2D material. Some example 2D materials for use in forming the channel include, but are not limited to, $WS_2$, $WSe_2$, $WTe_2$, $MoS_2$, $MoSe_2$, $MoTe_2$, $HfS_2$, $ZrS_2$, $TiS_2$, GaSe, InSe, phosphorene, and other similar materials. These materials may be deposited by an atomic layer deposition (ALD) process and may be 5-15 angstroms thick, the thinness lending to their name—2D material. The materials may be annealed during or after the device formation process to recrystallize or grow the crystals and thereby improve electrical characteristics. For the sake of simplicity, the use of conductive dielectrics will be disclosed.

Reference will now be made to the figures, which for the convenience of visualizing the 3D fabrication techniques described herein, illustrate a substrate undergoing a process flow in both top and cross-sectional views. Unless expressly indicated otherwise, each Figure represents one (or a set) of fabrication steps in a process flow for manufacturing the devices described herein. In the top and cross-sectional views of the Figures, connections between conductive layers or materials may be shown. However, it should be understood that these connections between various layers and masks are merely illustrative, and are intended to show a capability for providing such connections and should not be considered limiting to the scope of the claims.

Likewise, although the Figures and aspects of the disclosure may show or describe devices herein as having a particular shape, it should be understood that such shapes are merely illustrative and should not be considered limiting to the scope of the techniques described herein.

Figure 1B:
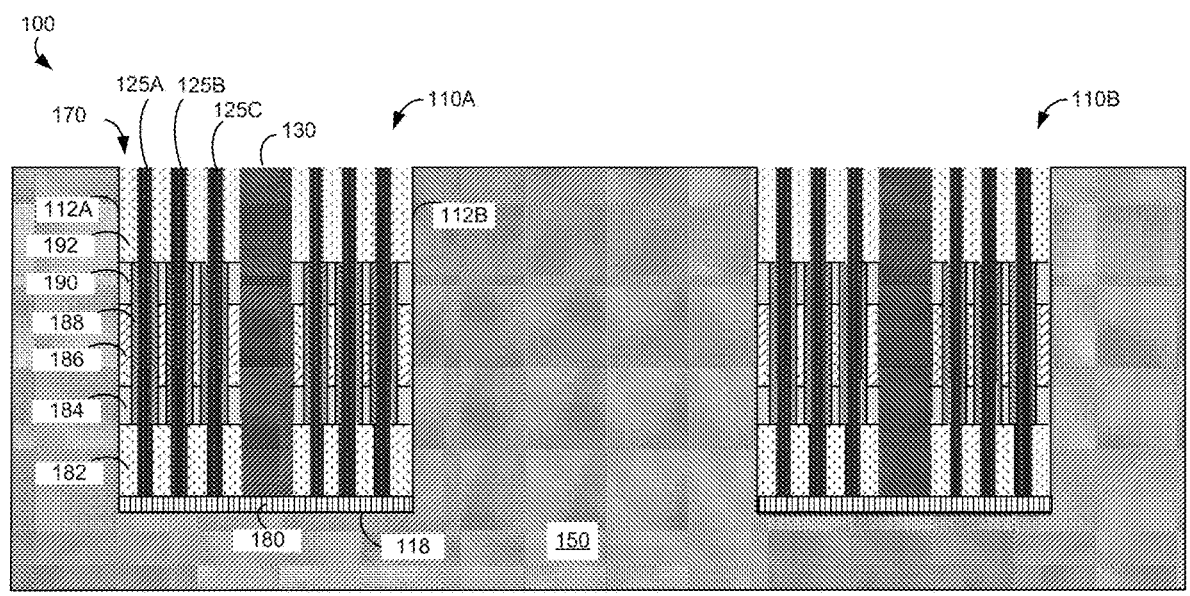
FIG. 1B is a cross-sectional view of vertical transistors formed in trenches, according to an embodiment.
Figure 1B:
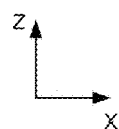

FIG. 1A is a top plan view of a device 100 including vertical transistors formed in trenches 110A, 110B, according to an embodiment, and FIG. 1B is a cross-sectional view of the device 100 along I-I' in FIG. 1A, according to an embodiment. In some embodiments, the device 100 includes a substrate 150. The substrate 150 may be a semiconductor substrate, such as silicon (Si). The substrate 150 may include the trenches 110A, 110B within which semiconductor devices (e.g., transistors) can be formed. In some embodiments, the device 100 includes more, fewer, or different components than shown in FIGS. 1A and 1B. For example, the substrate 150 may include additional trenches 110, or the device 100 may include different semiconductor devices (e.g., resistor, diode, capacitor, etc.) than shown in FIGS. 1A and 1B.

The trench 110A may be an indented portion of or protrusion into the substrate 150. In one aspect, each trench 110A corresponds to a three dimensional space defined by sidewalls 112A-112D, and a floor 118 in the substrate 150. The sidewalls 112A, 112B may be defined by parallel vertical surfaces of the substrate 150 extending along the Y-direction and the Z-direction, where the sidewall 112A and the sidewall 112B face each other along the X-direction. The sidewalls 112C, 112D may be defined by parallel vertical surfaces of the substrate 150 extending along the X-direction and the Z-direction, where the sidewall 112C and the sidewall 112D face each other along the Y-direction. The floor 118 may be defined by a horizontal surface of the substrate 150 extending along the X-direction and the Y-direction, and facing in the Z-direction.

Within the trench 110A, a dielectric layer 180 may be formed on the floor 118. The dielectric layer 180 may prevent growth of epitaxial layers on the floor 118. In one configuration, a divider 130 may be formed within the trench 110A on the dielectric layer 180. The divider 130 may be a dielectric structure. The divider 130 may extend from the sidewall 112C to the sidewall 112D along the Y-direction and extend from a top surface of the dielectric layer 180 along the Z-direction. In one aspect, the divider 130 operates as an insulator to separate a space within the trench 110A into two regions 145A, 145B. In some embodiments, additional dividers 130 may be formed in the trench 110A. Although the dividers 130 extend in the Y-direction, the dividers may alternatively extend in the X-direction or the X- and Y-directions.

Each region 145 within the trench 110A may include epitaxial layers 125 extending from the sidewall 112C to the sidewall 112D along the Y-direction and extending from the top surface of the dielectric layer 180 along the Z-direction to form multiple slots 170. In one configuration, the left region 145A may include three epitaxial layers 125A, 125B, 125C. The epitaxial layers 125A, 125B, 125C may include Si, SiN+, or SiP+. In one aspect, a first slot 170 can be a space defined by the sidewall 112A, the epitaxial layer 125A, and the dielectric layer 180; a second slot 170 can be a space defined by the epitaxial layers 125A, 125B, and the dielectric layer 180; a third slot 170 can be a space defined by the epitaxial layers 125B, 125C, and the dielectric layer 180; and a fourth slot 170 can be a space defined by the epitaxial layer 125C, the divider 130, and the dielectric layer 180. In some embodiments, different number of epitaxial layers 125 and slots 170 can exist within each region 145. Moreover, the epitaxial layers 125 may be oriented 90 degrees or other angles than shown. The epitaxial layers 125 may be spaced apart from one another relatively easily because the epitaxial layers 125 may be grown vertically.

Various components of a vertical transistor can be formed in each slot 170. Example components of the vertical transistor include a source/drain structure 182, a spacer 184, a gate structure 186, a spacer 190, a gate dielectric region 188, and a source/drain structure 192. The gate dielectric region 188 may include high-k material (e.g., $Si_3N_4$, $Al_2O_3$, $Ta_2O_5$, $TiO_2$, $ZrO_2$, and $HfO_2$). In one aspect, the spacers 184, 190 may operate as insulators to prevent shorting between the gate structure 186 and the source/drain structures 182, 192. In one configuration, the source/drain structure 182 can be formed above the top surface of the dielectric layer 180 along the Z-direction, and the spacer 184 can be formed above the source/drain structure 182 along the Z-direction. In addition, the gate structure 186 can be formed above the spacer 184 along the Z-direction, and the spacer 190 can be formed above the gate structure 186 along the Z-direction. Moreover, the source/drain structure 192 can be formed above the spacer 190 along the Z-direction. The gate dielectric region 188 can be formed on a portion of the epitaxial layer 125, such that a first end of the gate dielectric region 188 can directly contact the source/drain structure 182 and a second end of the gate dielectric region 188 can directly contact the source/drain structure 192. In some embodiments, one or more semiconductor devices (e.g., resistor, diode, capacitor, etc.) can be formed within each slot 170. In some embodiments, multiple transistors stacked along the Z-direction can be formed in a single slot 170.

The trench 110B and components in the trench 110B may be configured in a similar manner as the trench 110A and components in the trench 110A. Thus, detailed description on duplicated portion is omitted herein for the sake of brevity.

FIGS. 2-13 show a process of forming slots 170 within trenches, according to an embodiment. Each of FIGS. 2-13 generally refers to one or more process steps in a process flow, each of which is described in detail in connection with the respective Figure. For the purposes of simplicity and ease of visualization, some reference numbers may be omitted from some Figures.

Figure 2:
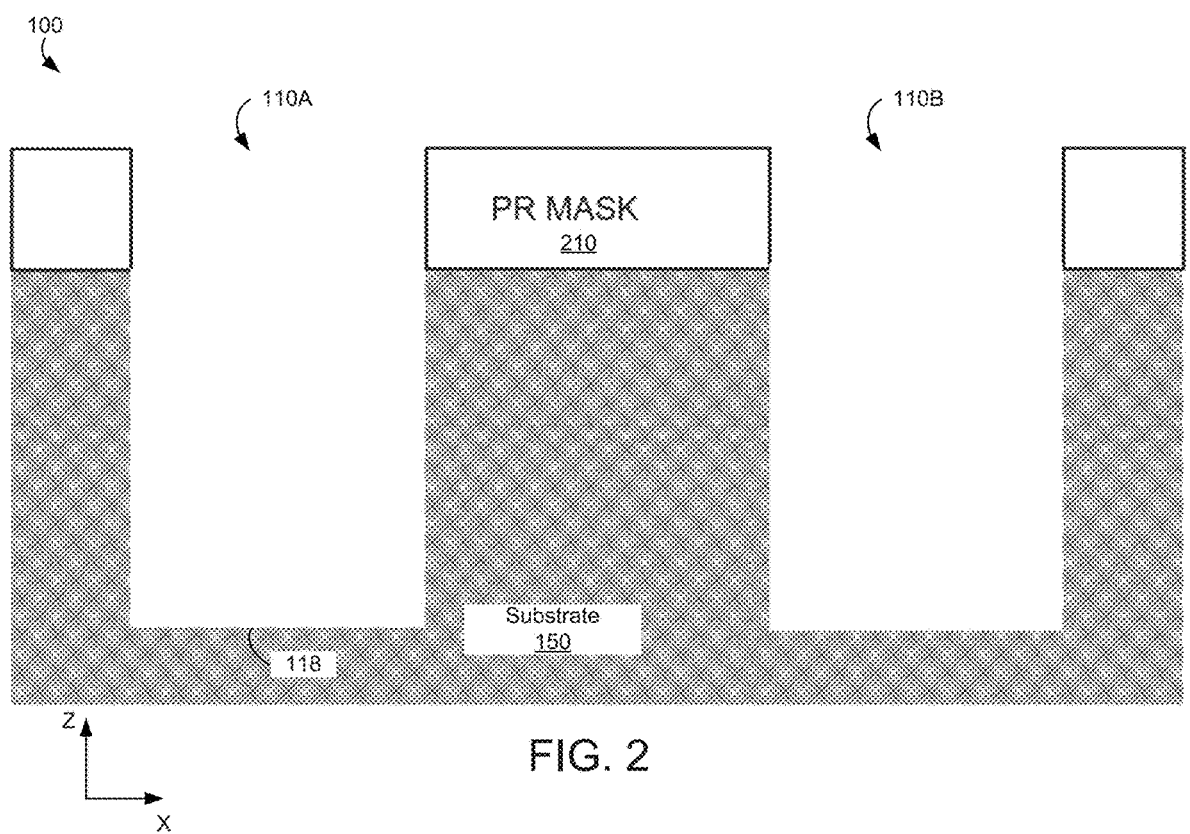
FIGS. 2-13 show top plan views and cross-sectional views of a process to form slots within trenches, according to an embodiment.

Referring to FIG. 2, illustrated is a cross-sectional view of the device 100 along I-I' in FIG. 1A, at the start 200 of the process flow. In one approach, a photoresist mask 210 may be placed on a top surface of the substrate 150. The substrate 150 may be a semiconductor substrate including Si. The photoresist mask 210 may have openings corresponding to areas of trenches 110A, 110B, such that portions of the substrate 150 can be exposed. The exposed portions of the substrate 150 can be etched to form the trenches 110A, 110B.

Figure 3:
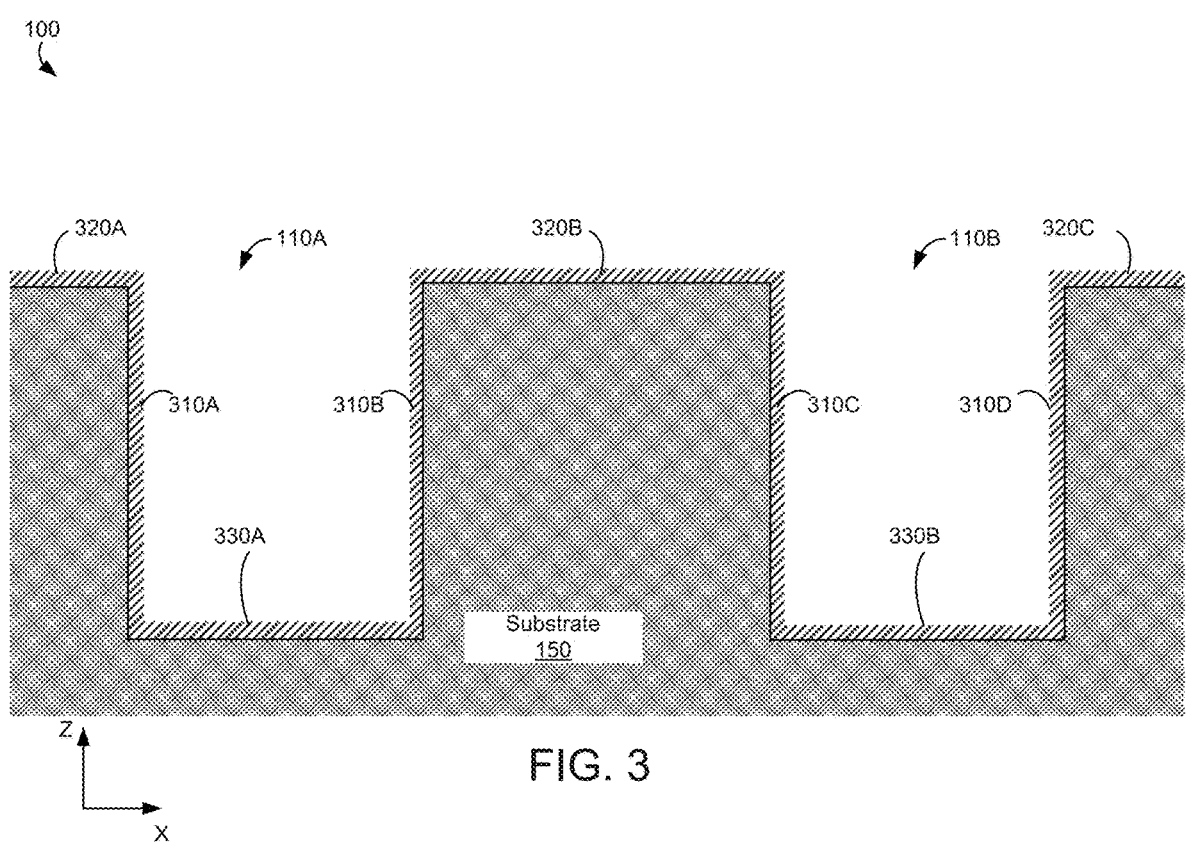

Referring to FIG. 3, illustrated is a cross-sectional view of the device 100, in the next stage 300 of the process flow. As shown, in this stage 300 in the process flow, the photoresist mask 210 of FIG. 2 is removed by a suitable stripping technique (e.g., by applying a chemical reactive to the photoresist mask 210 and relatively unreactive to the substrate 150). Once the photoresist mask 210 has been removed, a contiguous dielectric layer including dielectric layers 310A-310D, 320A-320C, 330A, 330B may be formed on the substrate 150, as shown in FIG. 3. For example, dielectric layers 330A, 330B can be formed on the floors 118 of the trenches 110A, 110B; dielectric layers 310A, 310B, 310C, 310D can be formed on the sidewalls (e.g., 112A, 112B) of the trenches 110A, 110B facing each other along the X-direction; and dielectric layers 320A, 320B, 320C can be formed on non-etched or non-trenched portions of the top surface of the substrate 150. Although not shown in the cross-sectional view of FIG. 3, the contiguous dielectric layer may include dielectric layers formed on the sidewalls (e.g., 112C, 112D) of the trenches 110 facing each other along the Y-direction. The dielectric layers can be formed through deposition. The deposition of dielectric layers can be performed using any type of deposition technique, including but not limited to ALD, chemical vapor deposition (CVD), and physical vapor deposition (PVD) (e.g., ALD deposited or grown dielectric).

Figure 4:
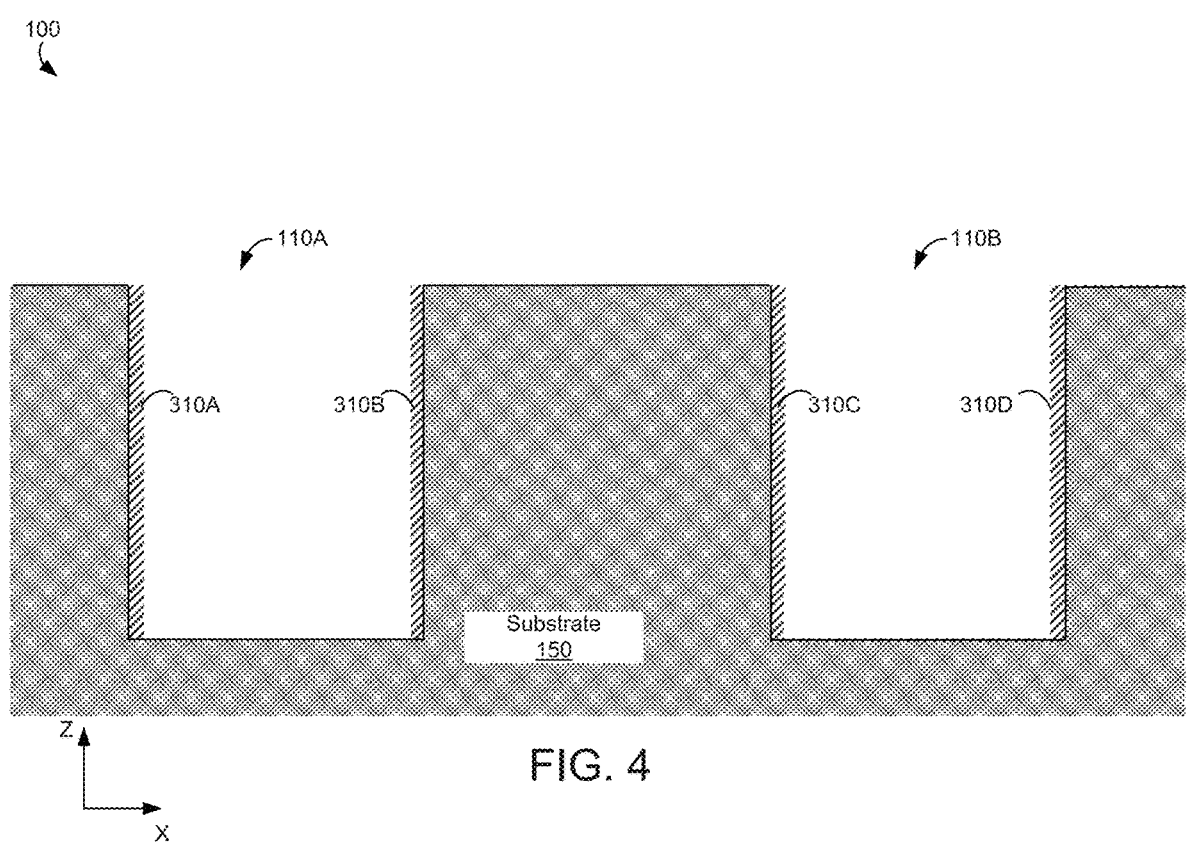

Referring to FIG. 4, illustrated is a cross-sectional view of the device 100, in the next stage 400 of the process flow. As shown, in this stage 400 in the process flow, the dielectric layers 320A-320C on the top surface of the substrate 150 and the dielectric layers 330A, 330B on the floors 118 of the trenches 110A, 110B in FIG. 3 are removed. The dielectric layers 320A-320B may be removed through etching. Examples of etching may include dry etching, wet etching, plasma etching, reactive ion etching (ME). As shown, the dielectric layers 310A-310D remain on the vertical sidewalls 112A and 112B of the trenches 110A and 110B after etching.

Figure 5:
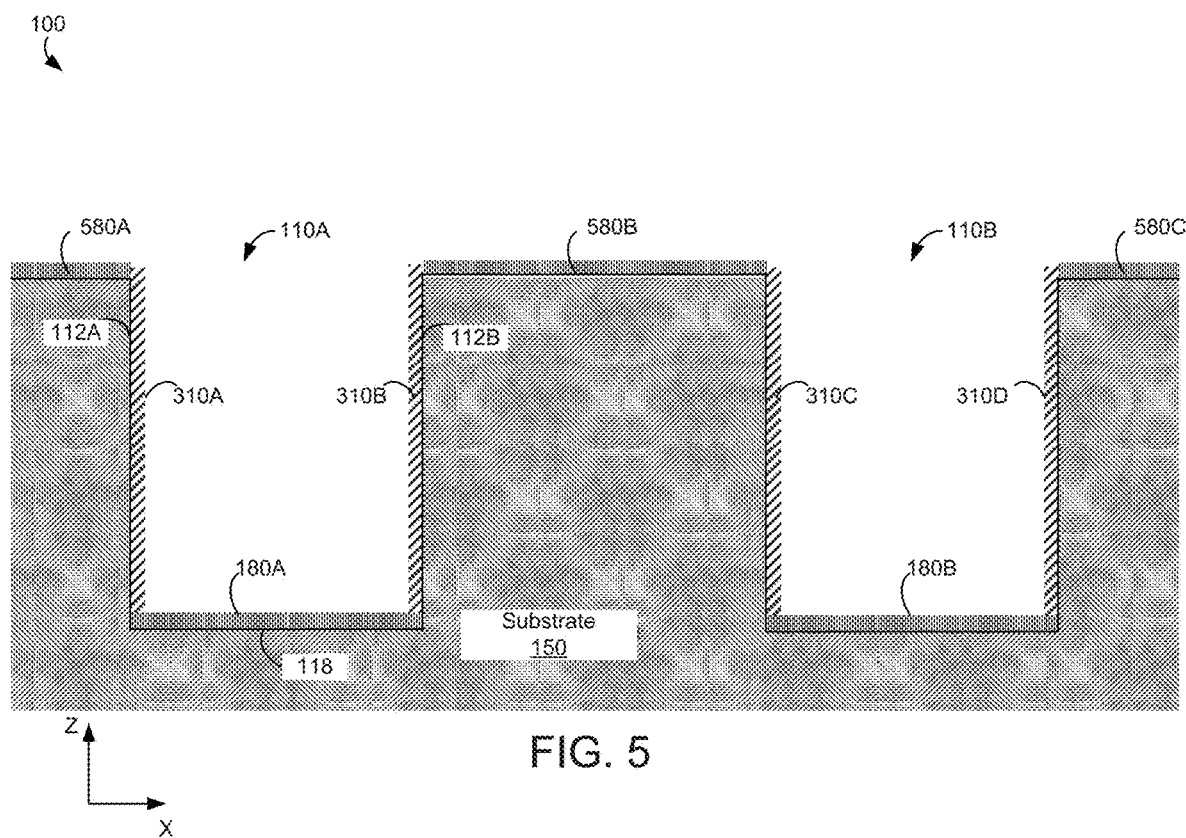

Referring to FIG. 5, illustrated is a cross-sectional view of the device 100, in the next stage 500 of the process flow. As shown, in this stage 500 in the process flow, dielectric layers 180A, 180B can be formed on the floors of the trenches 110A, 110B and dielectric layers 580A, 580B, 580C can be formed on non-etched or non-trenched portions of the top surface of the silicon substrate 150, and are not formed on top, horizontal surfaces of the dielectric layers 310A-310D. In one aspect, the dielectric layers 180A, 180B can prevent growth of epitaxial layers on the floors 118 of the trenches 110A, 110B. The dielectric layers 180A, 180B, 580A-580C can be formed through deposition. The deposition of the dielectric layers 180A, 180B, 580A-580C can be performed using any type of deposition technique, including but not limited to ALD, CVD, and PVD.

Figure 6:
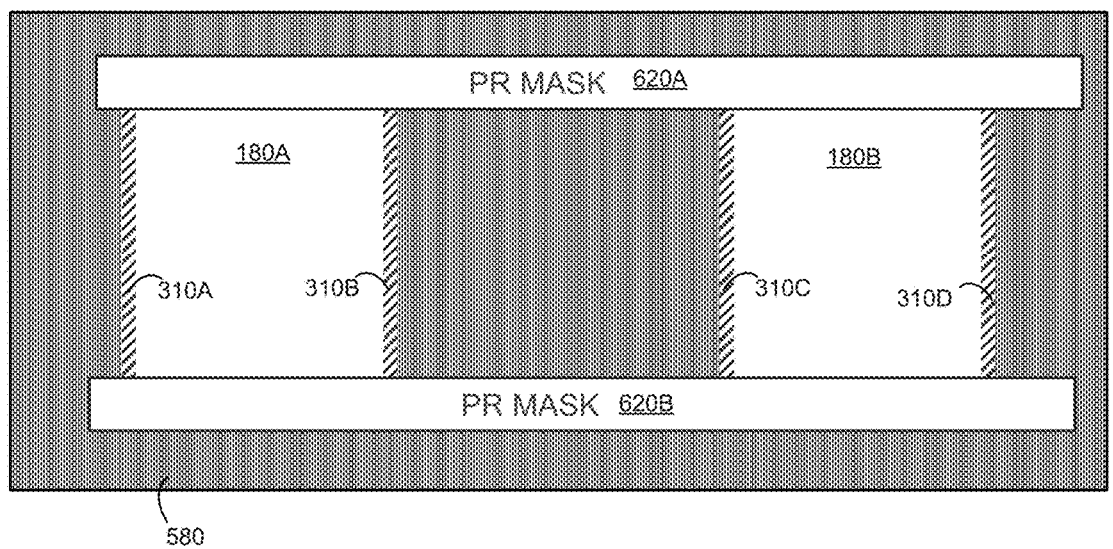

Referring to FIG. 6, illustrated is a top plan view of the device 100, in the next stage 600 of the process flow. As described with respect to FIG. 5, dielectric layers 180A, 180B can be formed on the floors 118 of the trenches 110A, 110B and dielectric layer 580 can be formed on non-etched or non-trenched portions of the top surface of the substrate 150. In FIG. 6, dielectric layers 180A, 180B are depicted as white regions, where the dielectric layer 580 is illustrated as a stripe region to distinguish the dielectric layers 180A, 180B on the floor 118 within the trench 110 from the dielectric layer 580 the top surface of the substrate 150. As shown, in this stage 600 in the process flow, photoresist masks 620A, 620B may be placed on areas of the dielectric layer 580 to cover or protect i) dielectric layers on the sidewalls (e.g., 112C, 112D) of the trenches 110A, 110B facing each other along the Y-direction and ii) end portions of the dielectric layers 310A, 310B, 310C, 310D on the sidewalls (e.g., 112A, 112B) of the trenches 110A, 110B facing each other along the X-direction. For example, the photoresist mask 620A may have a rectangular shape extending along the X-direction to cover i) the sidewall 112C of the trenches 110A, 110B and ii) top end portions of the sidewalls (e.g., 112A, 112B) of the trenches 110A, 110B facing each other along the X-direction. Similarly, the photoresist mask 620B may have a rectangular shape extending along the X-direction to cover i) the sidewall 112D of the trenches 110A, 110B and ii) bottom end portions of the sidewalls (e.g., 112A, 112B) of the trenches 110A, 110B facing each other along the X-direction.

Figure 7:
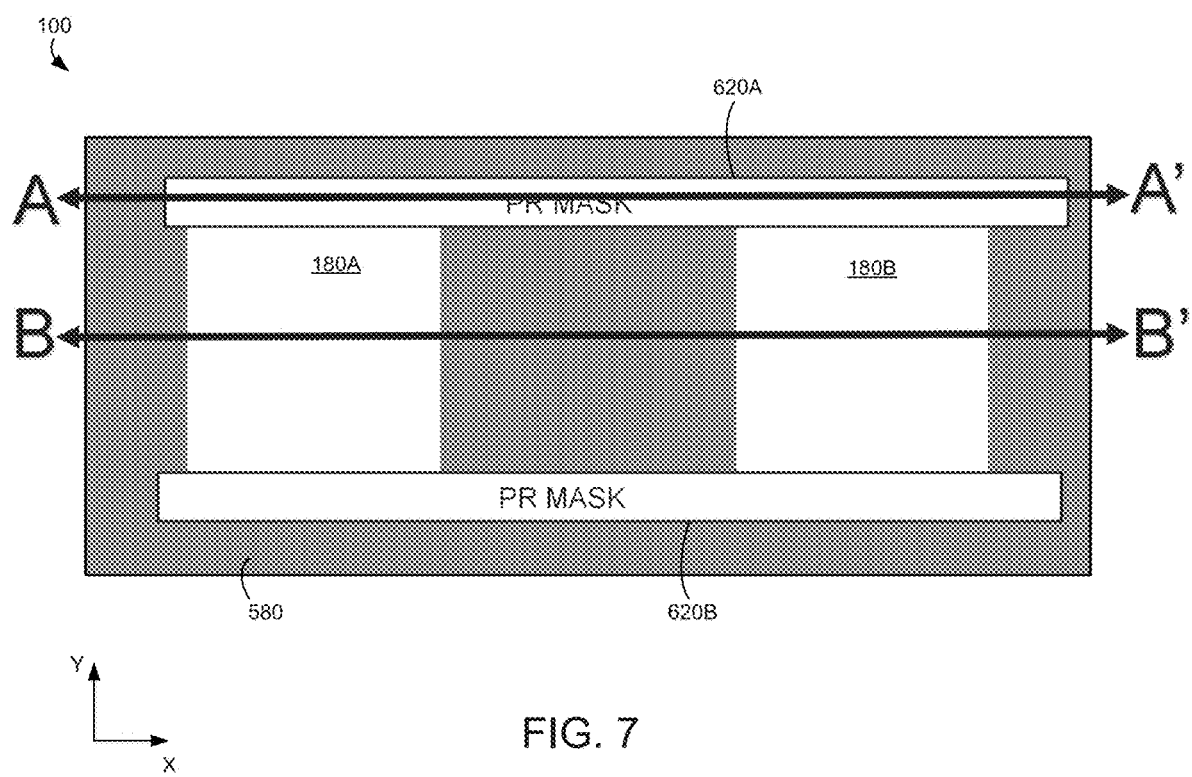
Figure 8:
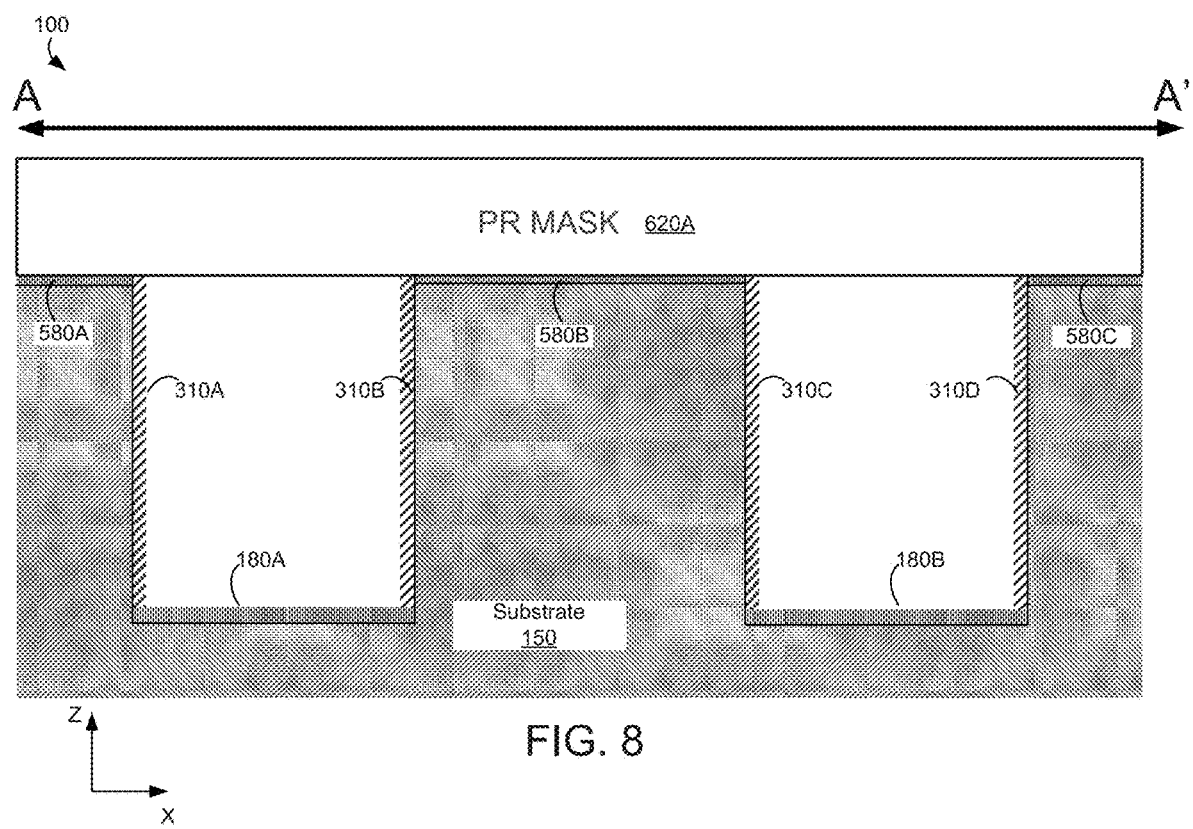
Figure 9:
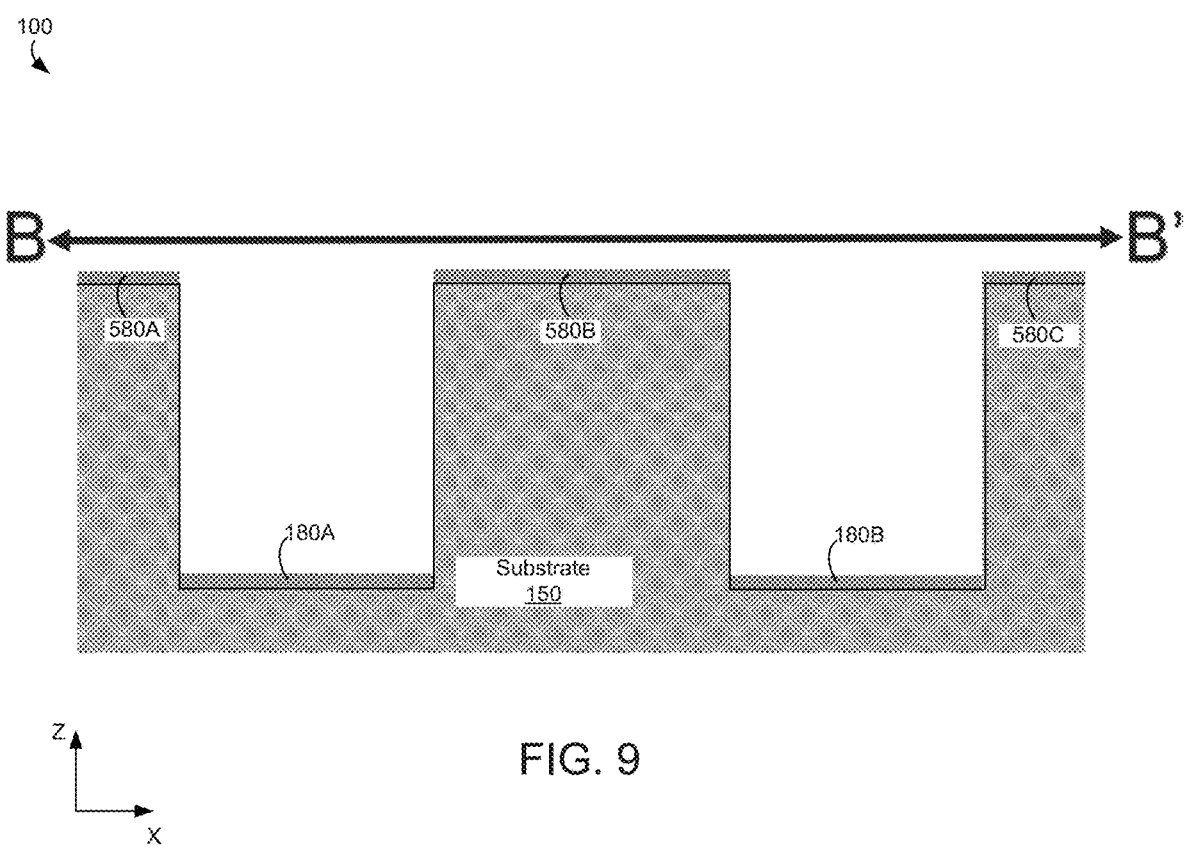

Referring to FIG. 7, illustrated is a top plan view of the device 100, in the next stage 700 of the process flow. FIG. 8 is a cross-sectional view of the device 100 along A-A' in FIG. 7, and FIG. 9 is a cross-sectional view of the device 100 along B-B' in FIG. 7. After placing the photoresist masks 620A, 620B, etching can be applied to remove exposed portions of the dielectric layers 310A-310D. Etching can be performed with materials or a process reactive to materials of the dielectric layers 310A-310D, but not be reactive to materials of the dielectric layers 180A, 180B, 580. Accordingly, exposed portions of the dielectric layers 310A-310D on the sidewalls (e.g., 112A, 112B) of the trenches 110A, 110B may be removed as shown in FIGS. 7 and 9, where dielectric layers on the sidewalls (e.g., 112C, 112D) of the trenches 110A, 110B facing each other along the Y-direction and the protected portions of the dielectric layers 310A-310D on the sidewalls (e.g., 112A, 112B) of the trenches 110A, 110B covered by the photoresist mask 620 may remain unetched.

Figure 10:
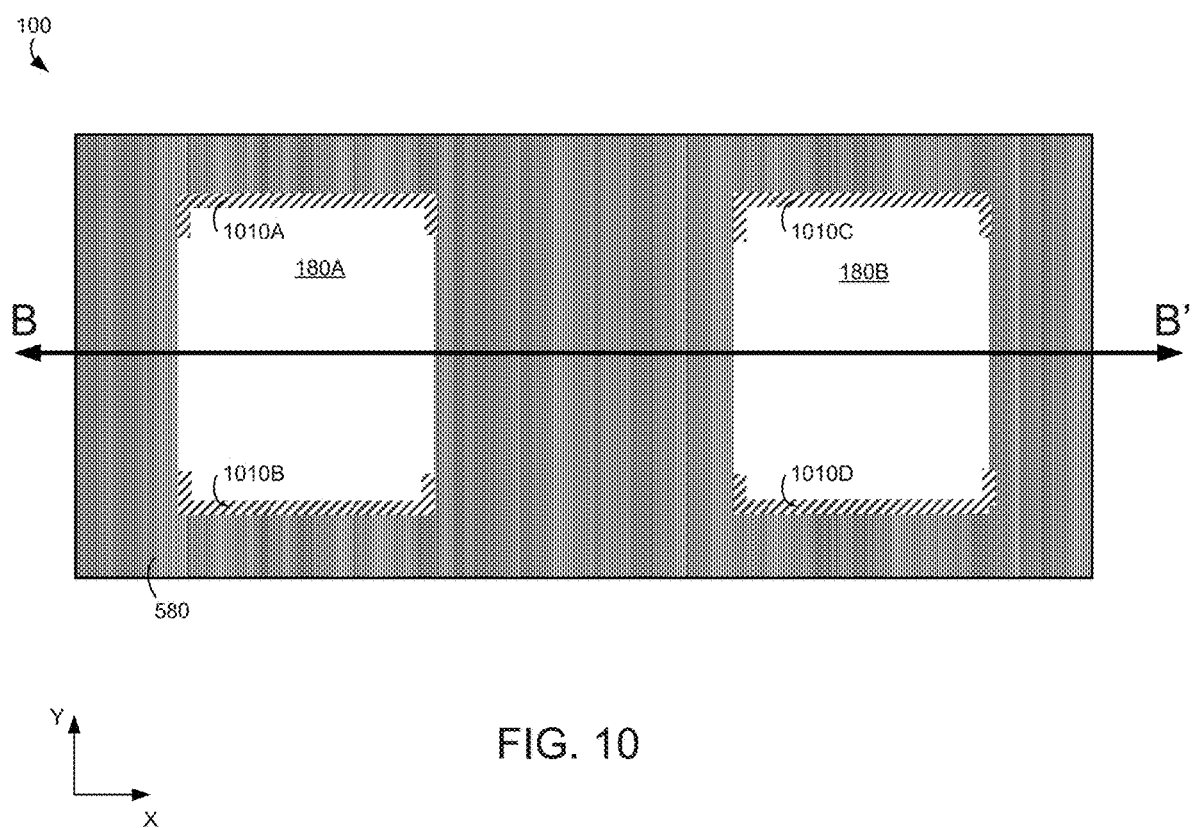

Referring to FIG. 10, illustrated is a top plan view of the device 100, in the next stage 1000 of the process flow. After performing the etching, the photoresist masks 620A, 620B may be removed, such that dielectric layers 1010A-1010D can be exposed. The photoresist masks 620A, 620B of FIG. 7 can be removed by a suitable stripping technique (e.g., by applying a chemical reactive to the photoresist masks 620A, 620B and relatively unreactive to the dielectric layers 180A, 180B, 580). Each dielectric layer 1010 may include a dielectric layer on the sidewall (e.g., 112C, 112D) facing along the Y-direction and the protected portions of the dielectric layers 310A-310D on the sidewalls (e.g., 112A, 112B), such that each dielectric layer 1010 may have a "U" shape as shown in FIG. 10. In one aspect, the dielectric layers 1010A-1010D may prevent growth of epitaxial layers on sidewalls (e.g., 112C, 112D) facing along the Y-direction.

Figure 11:
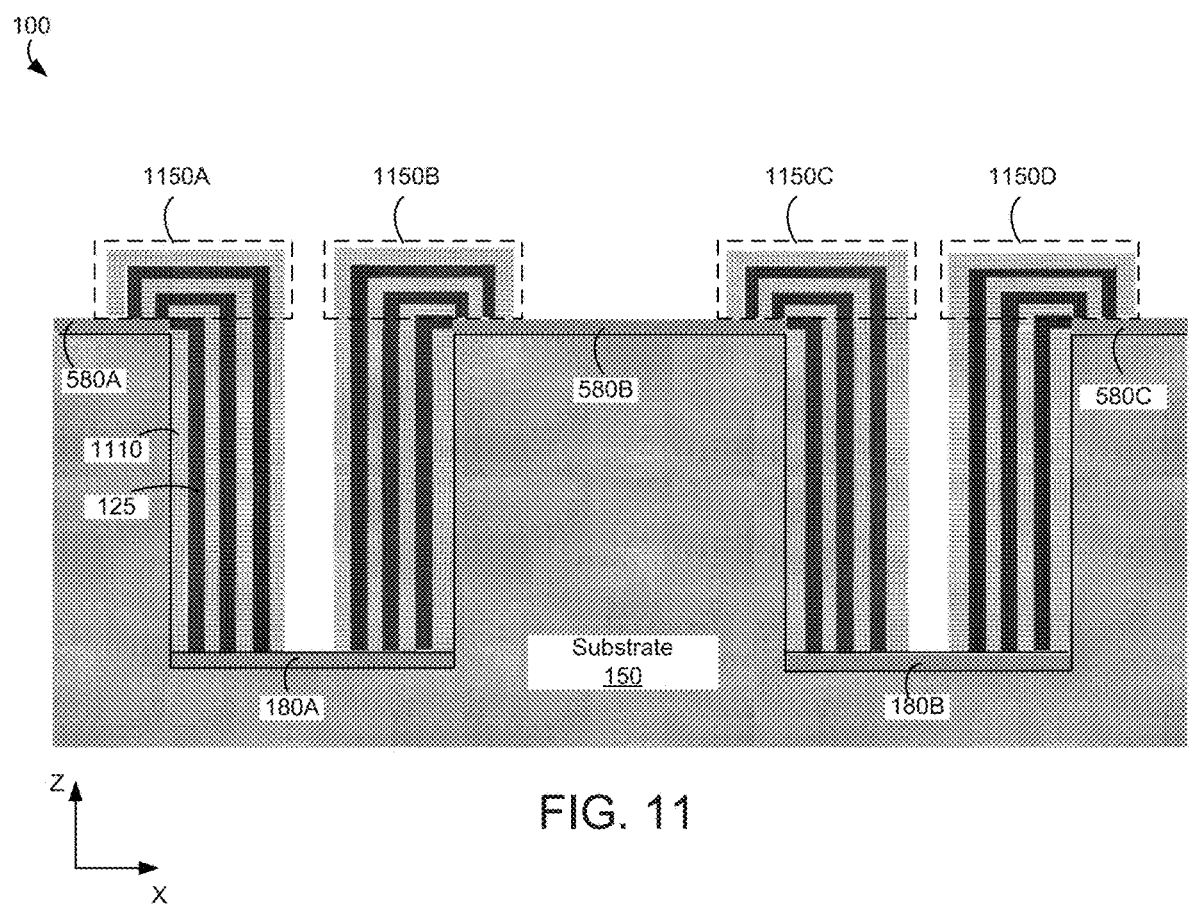

Referring to FIG. 11, illustrated is a cross-sectional view of the device 100 along B-B' in FIG. 10, in the next stage 1100 of the process flow. After removing the photoresist masks 620A, 620B (FIG. 8), a set of first epitaxial layers 1110 (also referred to as "epitaxial layers 1110 of a first type") and a set of second epitaxial layers 125 (also referred to as "epitaxial layers 125 of a second type") can be formed. The first epitaxial layers 1110 may include SiGe, and the second epitaxial layers 125 may include Si, SiN+, or SiP+. In one example, first epitaxial layers 1110 can be epitaxially grown on exposed portions of the sidewalls 112A, 112B not covered by the dielectric layer 1010, such that the first epitaxial layers 1110 may have surfaces or planes extending along the Z-direction and the Y-direction. Because of the dielectric layers 1010A-1010D remaining on the sidewalls 112C, 112D, the first epitaxial layers 1110 that are grown on sidewalls 112A, 112B may not be epitaxially grown on the sidewalls (e.g., FIG. 1A, 112C, 112D) facing along the Y-direction and the end portions of the sidewalls 112A, 112B. After forming the first epitaxial layers 1110, second epitaxial layers 125 can be epitaxially grown on the first epitaxial layers 1110, such that the second epitaxial layers 125 may have surfaces or planes extending along the Z-direction and the Y-direction. Again, because of the dielectric layers 1010A-1010D, the second epitaxial layers 125 may not be epitaxially grown on the sidewalls 112C, 112D facing along the Y-direction. After forming the second epitaxial layers 125, additional first epitaxial layers 11110 can be epitaxially grown on the second epitaxial layers 125, such that the additional first epitaxial layers 1110 may have planes or surfaces extending along the Z-direction and the Y-direction. The process can be repeated to form the set of first epitaxial layers 1110 and the set of second epitaxial layers 125 stacked along the X-direction within the trenches 110A, 110B, where each of the set of second epitaxial layers 125 can be interposed between two corresponding ones of the set of first epitaxial layers 1110. In one aspect, excess portions 1150A-1150D of the set of first epitaxial layers 1110 and the set of second epitaxial layers 125 may be formed on or over the dielectric layers 580A, 580B, 580C due to epitaxial growth.

Figure 12:
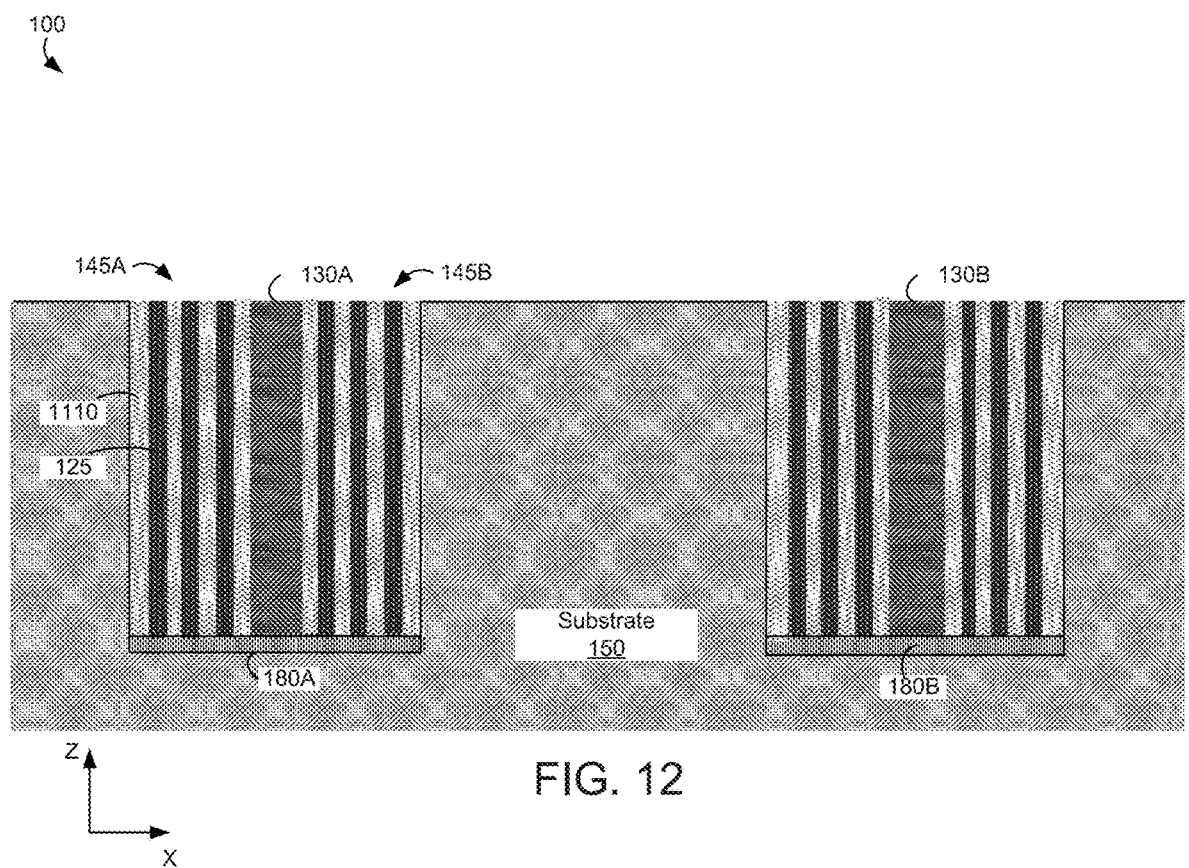

Referring to FIG. 12, illustrated is a cross-sectional view of the device 100, in the next stage 1200 of the process flow. After forming the set of first epitaxial layers 1110 and the set of second epitaxial layers 125, a divider 130 can be formed in a remaining space in each trench 110A, 110B. The dividers 130A, 130B may include dielectric materials. The divider 130 can be formed through deposition. The deposition of the dividers 130 can be performed using any type of deposition technique, including but not limited to ALD, CVD, and PVD. The divider 130 may extend between a center portion of dielectric layer 1010 (e.g., 1010A) to a center portion of another dielectric layer 1010 (e.g., 1010B) along the Y-direction within the trench 110A, such that each of the trenches 110 can be divided into two regions 145A, 145B. In one aspect, the divider 130 operates as an insulator to electrically isolate epitaxial layers 1110, 125 in the left region 145A from epitaxial layers, 1110, 125 in the right region 145B.

After forming the dividers 130A, 130B, the portions 1150A-1150D of the set of first epitaxial layers 1110 and the set of second epitaxial layers 125 formed on or over the dielectric layers 580A, 580B, 580C can be removed. The portions 1150A-1150D of the set of first epitaxial layers 1110 and the set of second epitaxial layers 125 may be removed through etching. In addition, the dielectric layers 580A-580C may be removed through etching. Examples of etching may include dry etching, wet etching, plasma etching, RIE or any other etching. A chemical-mechanical polish (CMP) may be performed such that a top surface of the substrate 150 can be exposed and polished, such that the top surface of the substrate 150, edges of the epitaxial layers 1110, 125 and the divider 130 can have a flushed surface.

Figure 13:
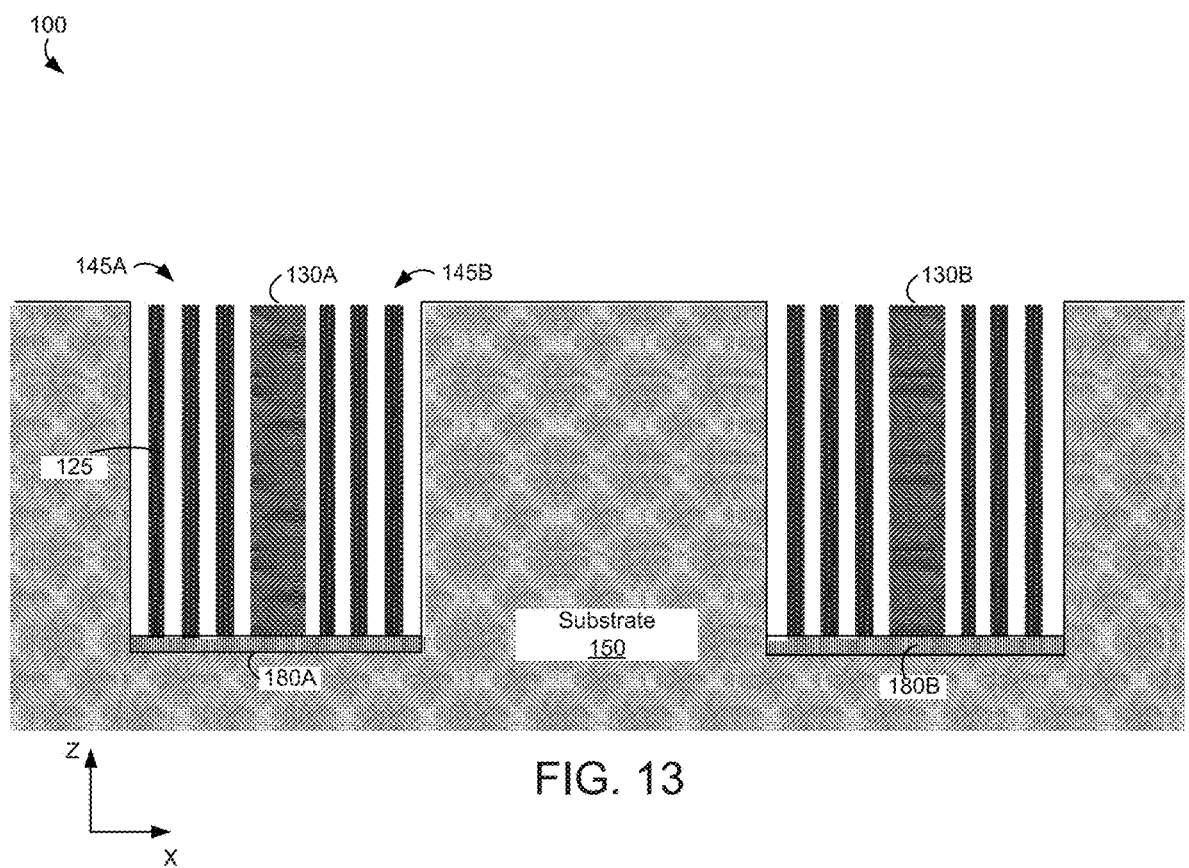

Referring to FIG. 13, illustrated is a cross-sectional view of the device 100, in the next stage 1300 of the process flow. After forming the dividers 130A, 130B and removing the excess portions 1150A-1150D of the set of first epitaxial layers 1110 and the set of second epitaxial layers 125, the first set of epitaxial layers 1110 can be removed. The first set of epitaxial layers 1110 can be removed by etching. Etching can be performed with materials or a process reactive to materials of the set of first epitaxial layers 1110, but not reactive to materials of the set of second epitaxial layers 125, the dividers 130, and the dielectric layers 180A, 180B. Accordingly, the set of epitaxial layers 1110 can be removed to form narrow spaces or slots 170. In one aspect, vertical semiconductor devices (e.g., transistors, resistors, capacitors, diode, etc.) can be formed in each slot 170 and on the second epitaxial layers 125 with high density. The vertical semiconductor devices may be N-MOS and/or P-MOS. The remaining set of second epitaxial layers 125 may also be referred to as vertical or 3D nano sheets.

Figure 14:
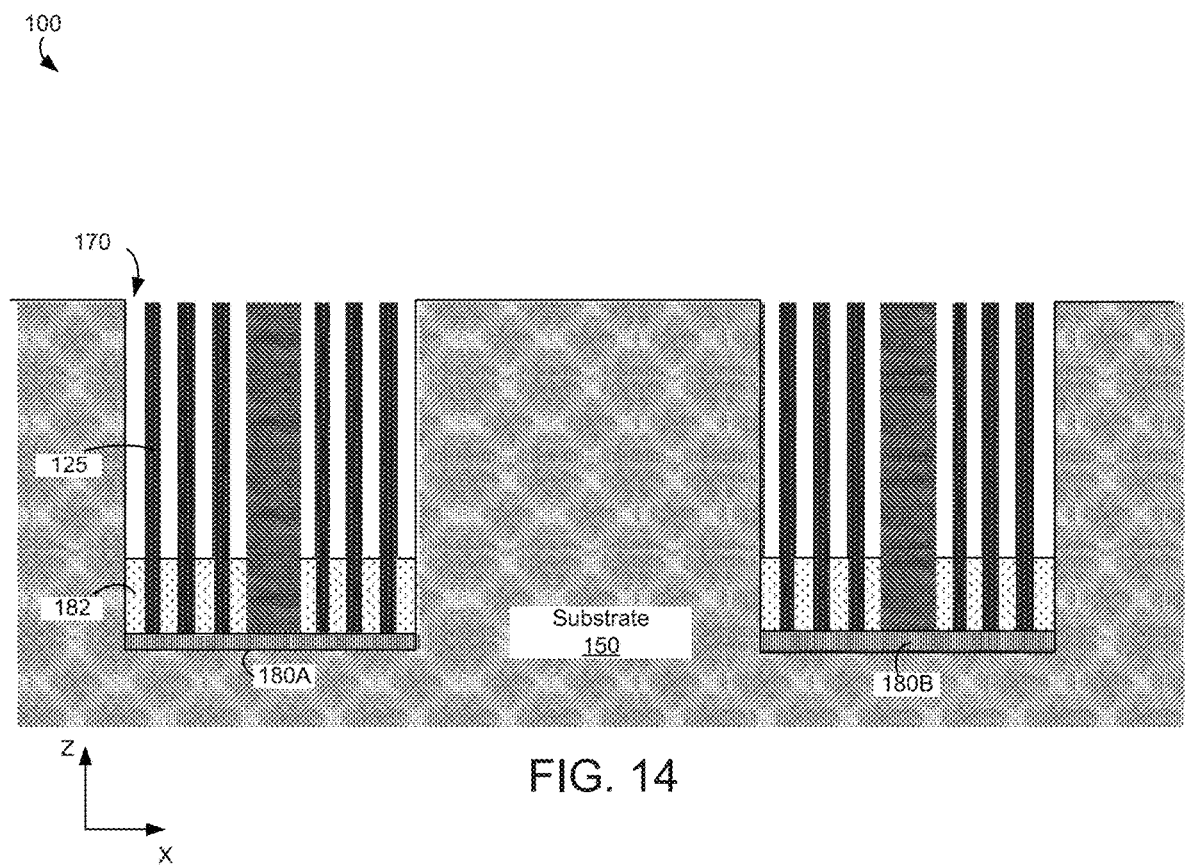
FIGS. 14-23 show top plan views and cross-sectional views of a process to form vertical transistors in the slots, according to an embodiment.

Referring to FIG. 14, illustrated is a cross-sectional view of the device 100, in the next stage 1400 of the process flow. After removing the set of first epitaxial layers 1110, source/drain structures 182 can be formed in each slot 170. The source/drain structures 182 may include silicide metal or otherwise. The source/drain structures 182 can be formed through a deposition process by filling a bottom portion of each slot 170 or filling and etching to a certain height within each slot. The heights of the source/drain structures 182 may vary depending on desired performance of transistors being formed in the slots 170. The deposition of the source/drain structures 182 can be performed using any type of deposition technique, including but not limited to ALD, CVD, and PVD. In one aspect, the height of the source/drain structures 182 along the Z-direction is shorter than the height of the trench along the Z-direction, such that portions of the set of second epitaxial layers 125 can remain exposed. In an embodiment, the source/drain structures 102 may be shorted together.

Figure 15:
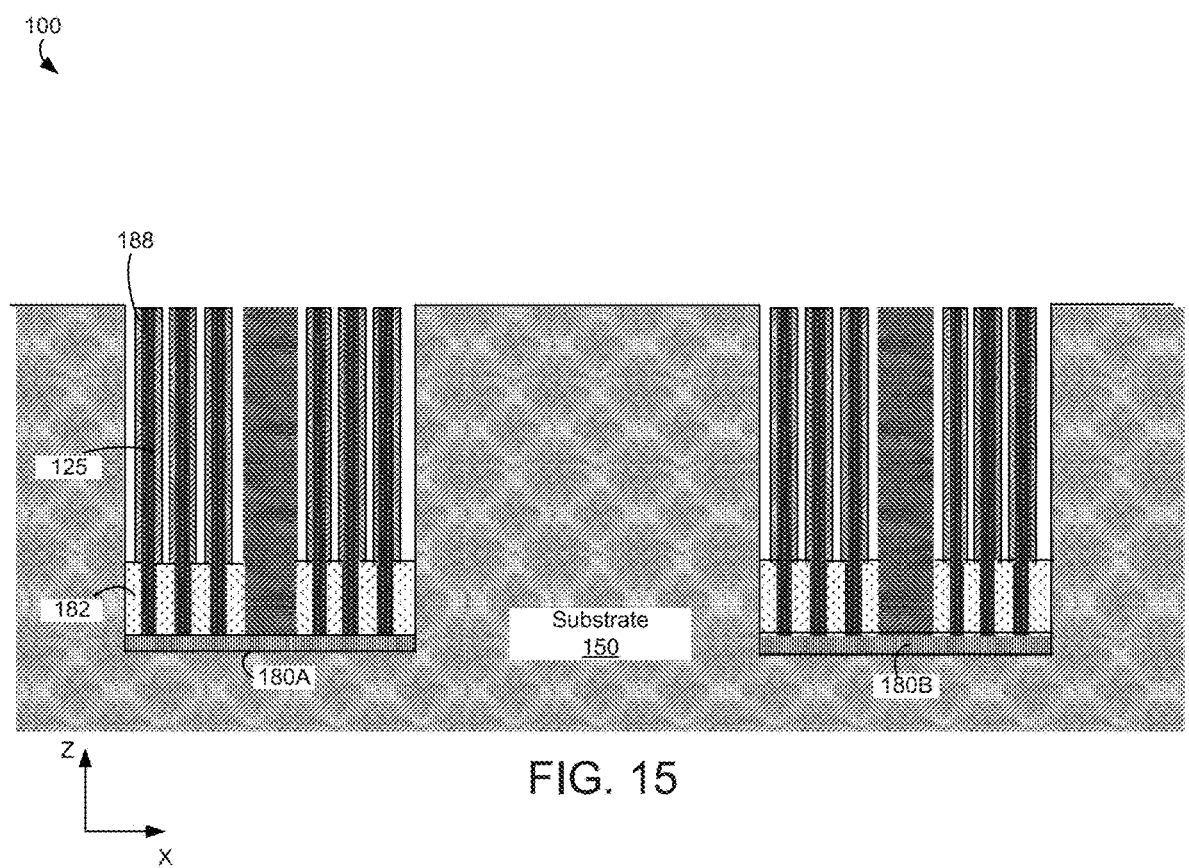

Referring to FIG. 15, illustrated is a cross-sectional view of the device 100, in the next stage 1500 of the process flow. After forming the source/drain structures 182, the gate dielectric regions 188 can be formed on the exposed portions of the set of second epitaxial layers 125, such that the gate dielectric regions 188 may extend along the Y-direction. The gate dielectric regions 188 may include high-k dielectric materials such as $Si_3N_4$, $Al_2O_3$, $Ta_2O_5$, $TiO_2$, $ZrO_2$, and $HfO_2$. The gate dielectric regions 188 may correspond to vertical channels of vertical transistors. The gate dielectric regions 188 may be formed through a deposition process. The deposition of the gate dielectric regions 188 can be performed using any type of deposition technique, including but not limited to ALD, CVD, and PVD. In one approach, silicide metal deposition and etching/salicide can be performed. In one aspect, a thickness of each gate dielectric region 188 along the X-direction may be less than a thickness of the source/drain structure 182 along the X-direction, such that a space can exist in each slot 170. The dimensions of the gate dielectric region 188 (channel) may be varied depending on desired characteristics and performance of the transistor(s).

Figure 16:
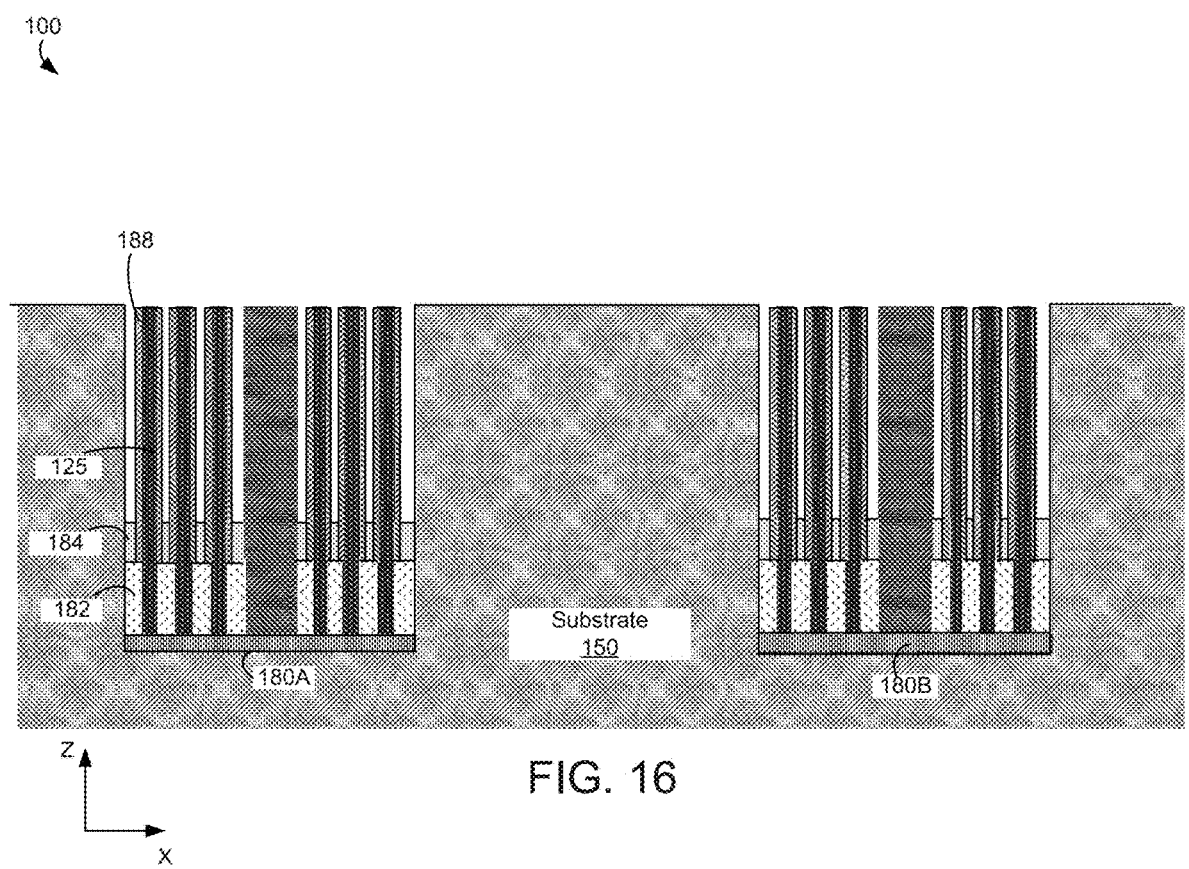

Referring to FIG. 16, illustrated is a cross-sectional view of the device 100, in the next stage 1600 of the process flow. After forming the gate dielectric regions 188, spacers 184 can be formed on the source/drain structures 182. The spacers 184 may be a dielectric. The spacers 184 may operate as insulators for the source/drain structures. The spacers 184 can be formed through a deposition process by filling a bottom portion of a remaining space in each slot 170. The deposition of the spacers 184 can be performed using any type of deposition technique, including but not limited to ALD, CVD, and PVD. Again, the spacers 184 may be filled a certain amount within the slots 170 or filled to the top and etched downwards to define the heights in a precision manner. The height of the spacers 184 may be varied depending on the desired performance of the transistor (e.g., shorter to increase capacitance).

Figure 17:
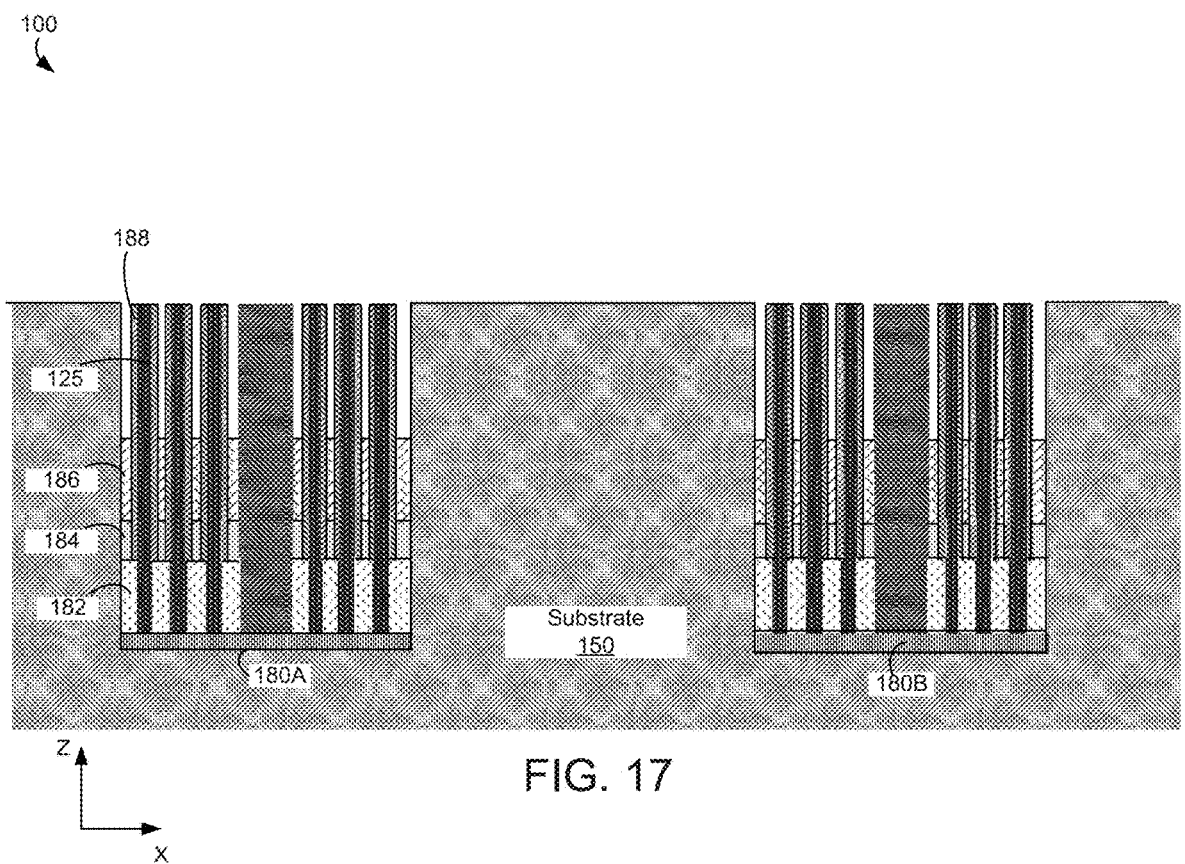

Referring to FIG. 17, illustrated is a cross-sectional view of the device 100, in the next stage 1700 of the process flow. After forming the spacers 184, gate structures 186 can be formed on the spacers 184. The gate structures 186 can be formed through a deposition process by filling a bottom portion of a remaining space in each slot 170. The deposition of the gate structures 186 can be performed using any type of deposition technique, including but not limited to ALD, CVD, and PVD.

Figure 18:
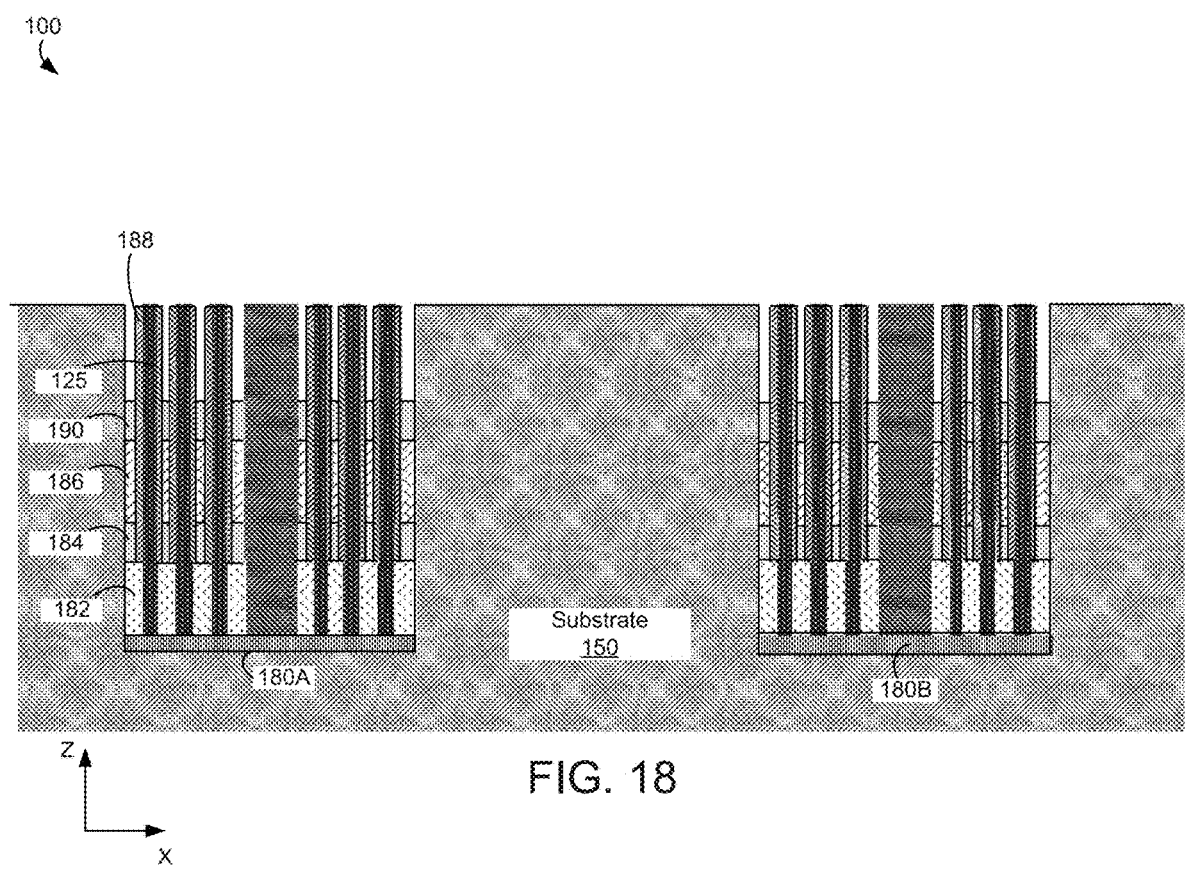

Referring to FIG. 18, illustrated is a cross-sectional view of the device 100, in the next stage 1800 of the process flow. After forming the gate structures 186, additional spacers 190 can be formed on the gate structures 186. The spacers 190 may be a dielectric. The spacers 190 can be formed through a deposition process by filling a bottom portion of a remaining space in each slot 170. The deposition of the spacers 190 can be performed using any type of deposition technique, including but not limited to ALD, CVD, and PVD and filled or filled/etched, as previously described.

Figure 19:
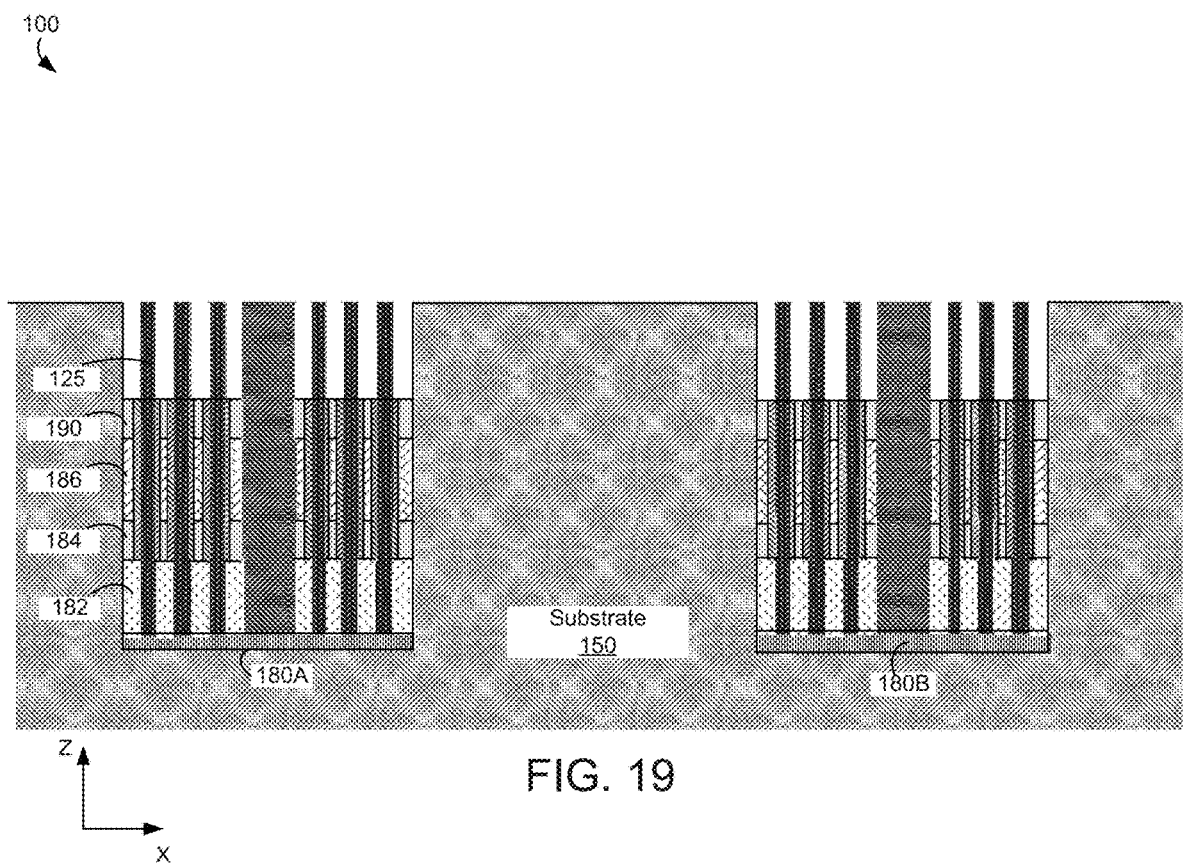

Referring to FIG. 19, illustrated is a cross-sectional view of the device 100, in the next stage 1900 of the process flow. After forming the spacers 190, exposed portions of the gate dielectric regions 188 (see FIG. 18) can be removed. The exposed portions of the gate dielectric regions 188 may be removed through etching. Examples of etching may include dry etching, wet etching, plasma etching, RIE or any etching.

Figure 20:
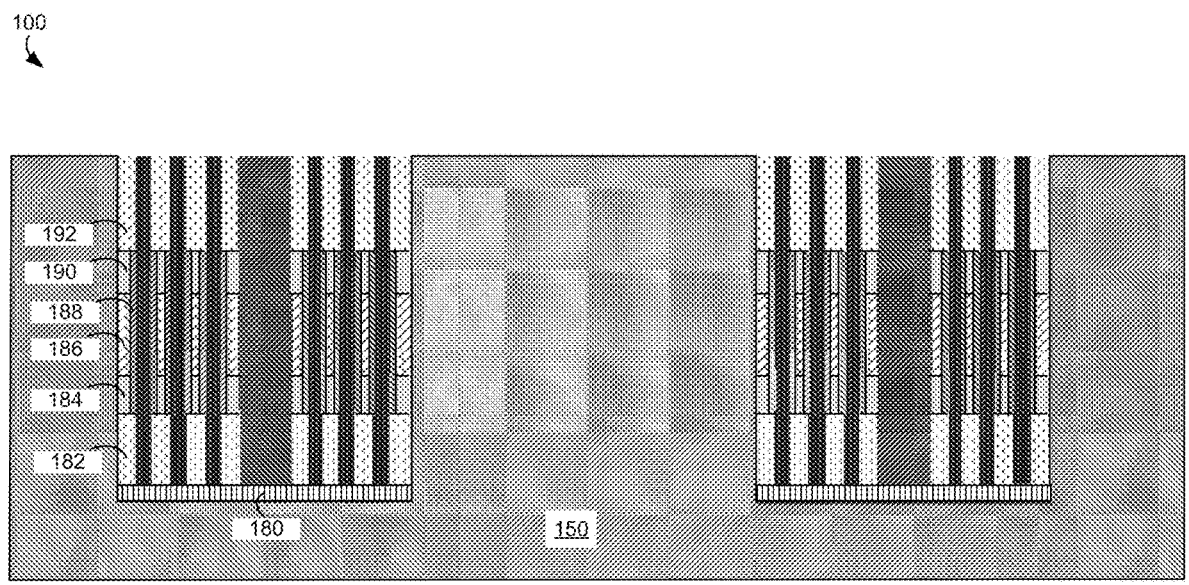

Referring to FIG. 20, illustrated is a cross-sectional view of the device 100, in the next stage 2000 of the process flow.

Figure 21:
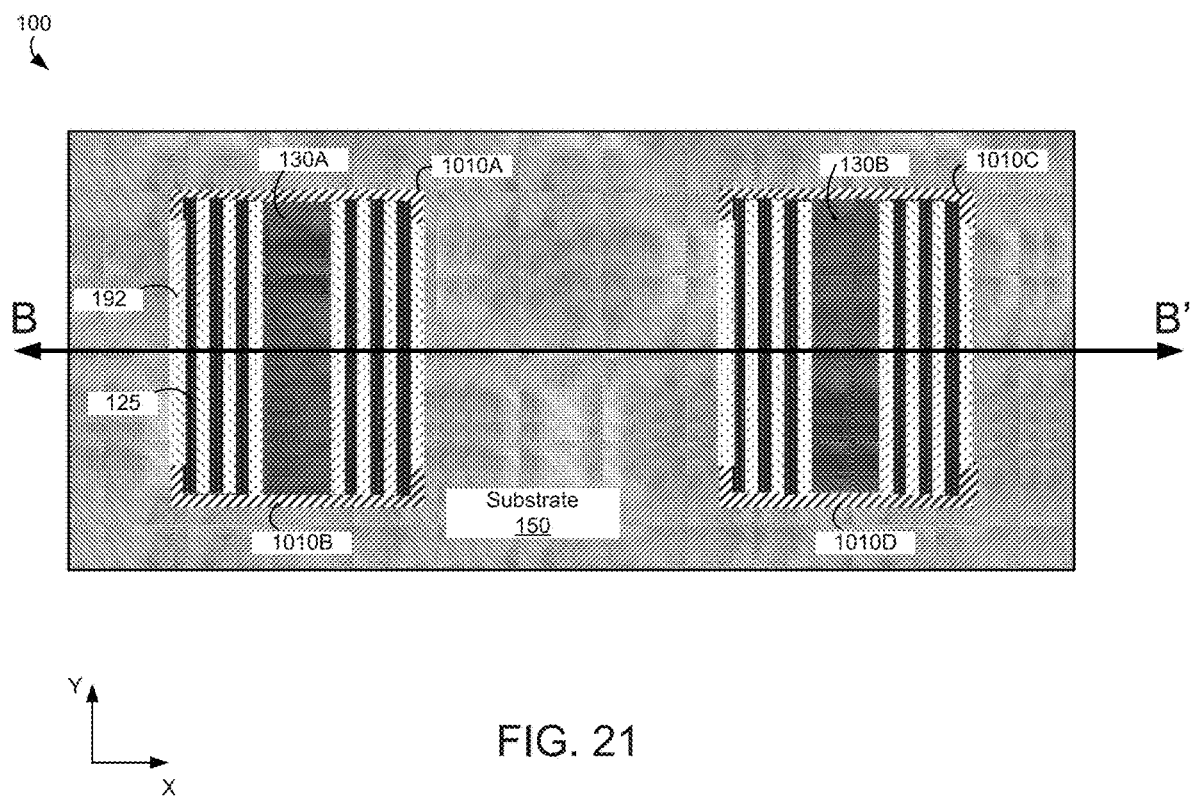

FIG. 21 illustrates a top plan view of the device 100 corresponding to the cross-sectional view in FIG. 20. After removing the exposed portions of the gate dielectric regions 188, additional source/drain structures 192 can be formed. The source/drain structures 192 may include the same or different metal as the source/drain structures 182. The source/drain structures 192 can be formed through a deposition process by filling a remaining portion of each slot 170. The deposition of the source/drain structures 192 can be performed using any type of deposition technique, including but not limited to ALD, CVD, and PVD. In one approach, silicide metal deposition and etching/salicide can be performed. In one aspect, the source/drain structures 192 can be formed along the Z-direction, such that edges of the source/drain structures 192 and the top surface of the substrate 150 can have a flushed surface. As shown in FIG. 21, the dividers 130A, 130B, and the epitaxial layers 125 may extend along the Y-direction between the dielectric layers 1010A, 1010B or between the dielectric layers 1010C, 1010D. Moreover, vertical transistors or source/drain structures 192 of the vertical transistors may extend along the Y-direction in narrow slots 170 defined by sidewalls 112 and epitaxial layers 125 (i.e., vertical nano sheets).

Figure 22:
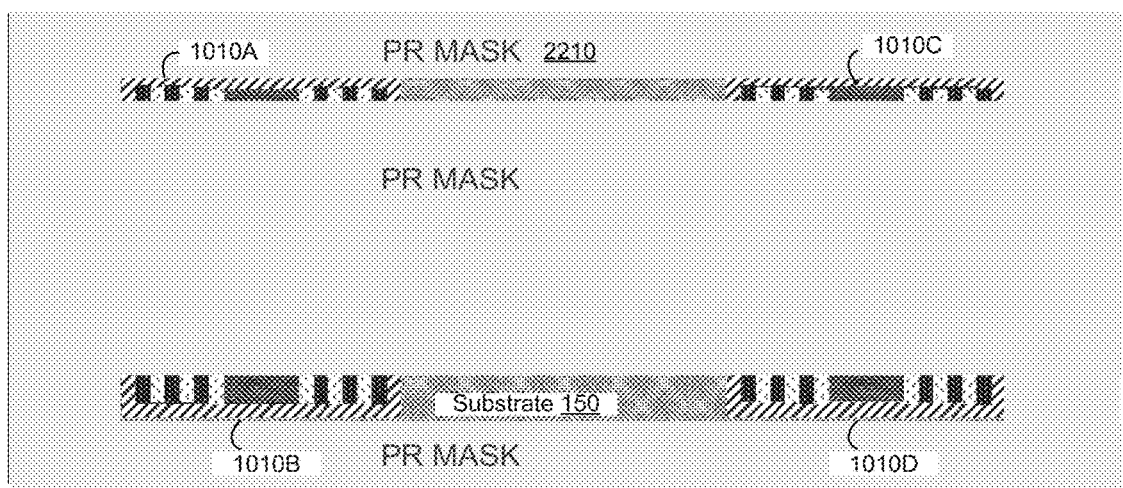
Figure 22:
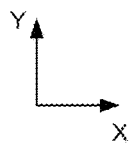

Referring to FIG. 22, illustrated is a top plan view of the device 100, in the next stage 2200 of the process flow. After forming the source/drain structures 192, a photoresist mask 2210 may be placed on the top surface of the substrate 150. The photoresist mask 2210 may have openings corresponding to areas covering the dielectric layers 1010A, 1010B, 1010C, 1010D, such that the dielectric layers 1010A, 1010B, 1010C, 1010D, portions of epitaxial layers 125 and portions of the source/drain structures 192 can be exposed. The exposed portions may be removed through etching to obtain the device 100 as shown in FIG. 23.

Figure 23:
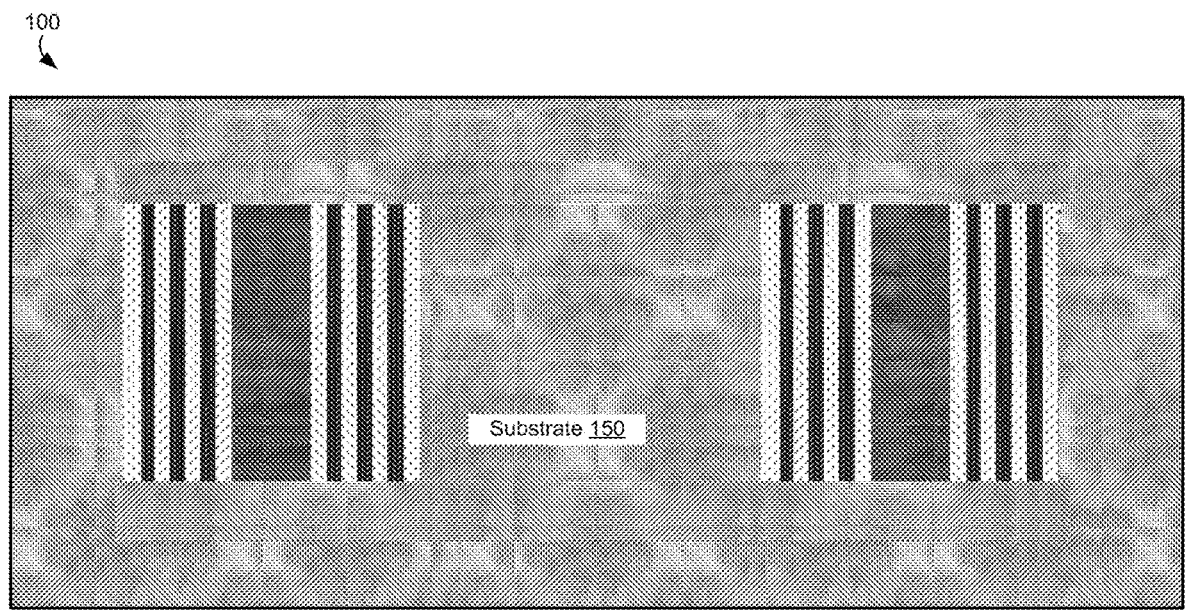
Figure 23:
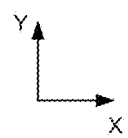
Figure 24:
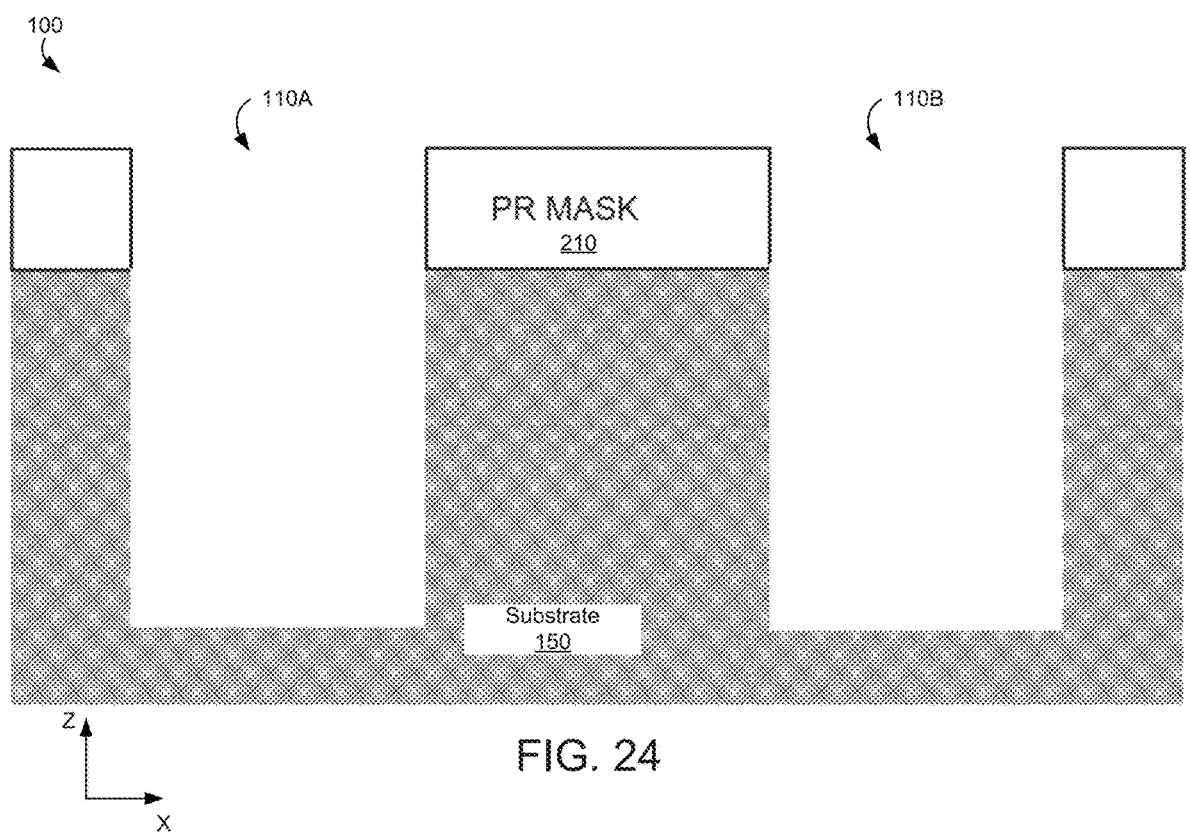
FIGS. 24-37 show top plan views and cross-sectional views of a process to form a N-type transistor in a first trench and a P-type transistor in a second trench, according to an embodiment.
Figure 25:
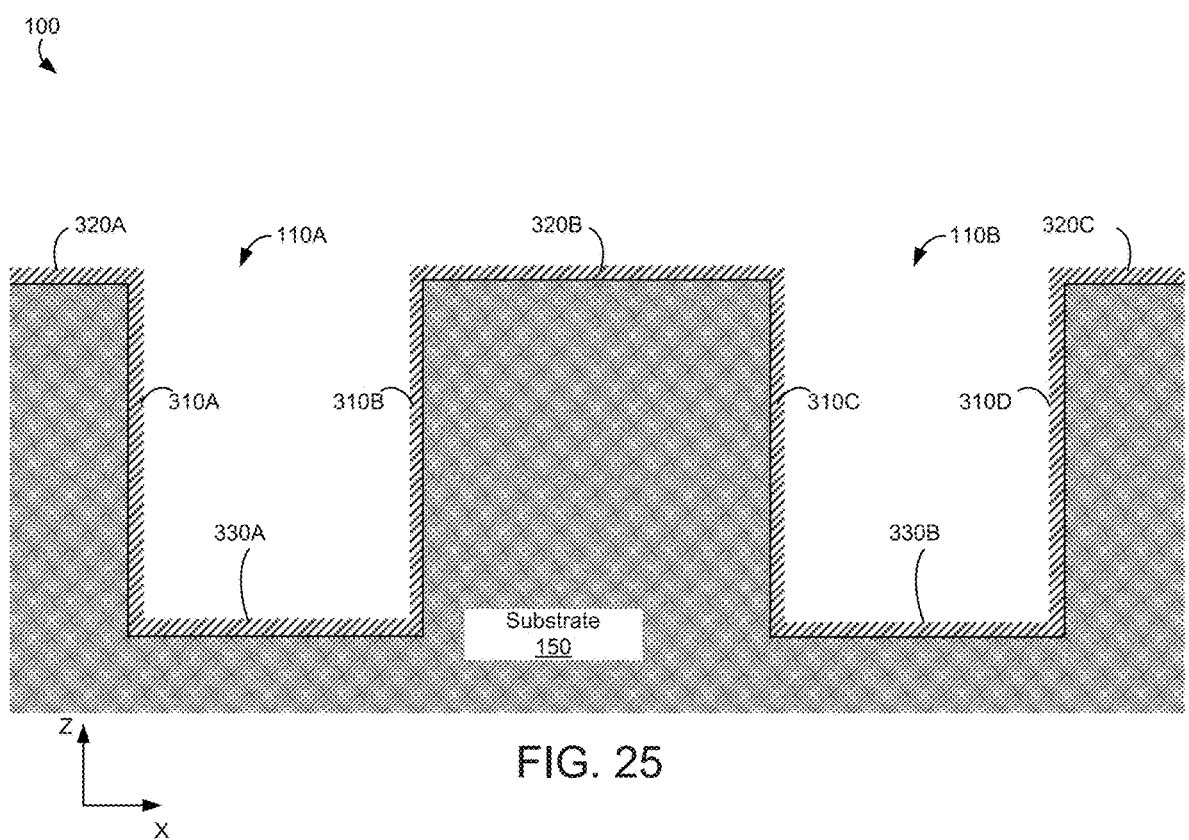
Figure 26:
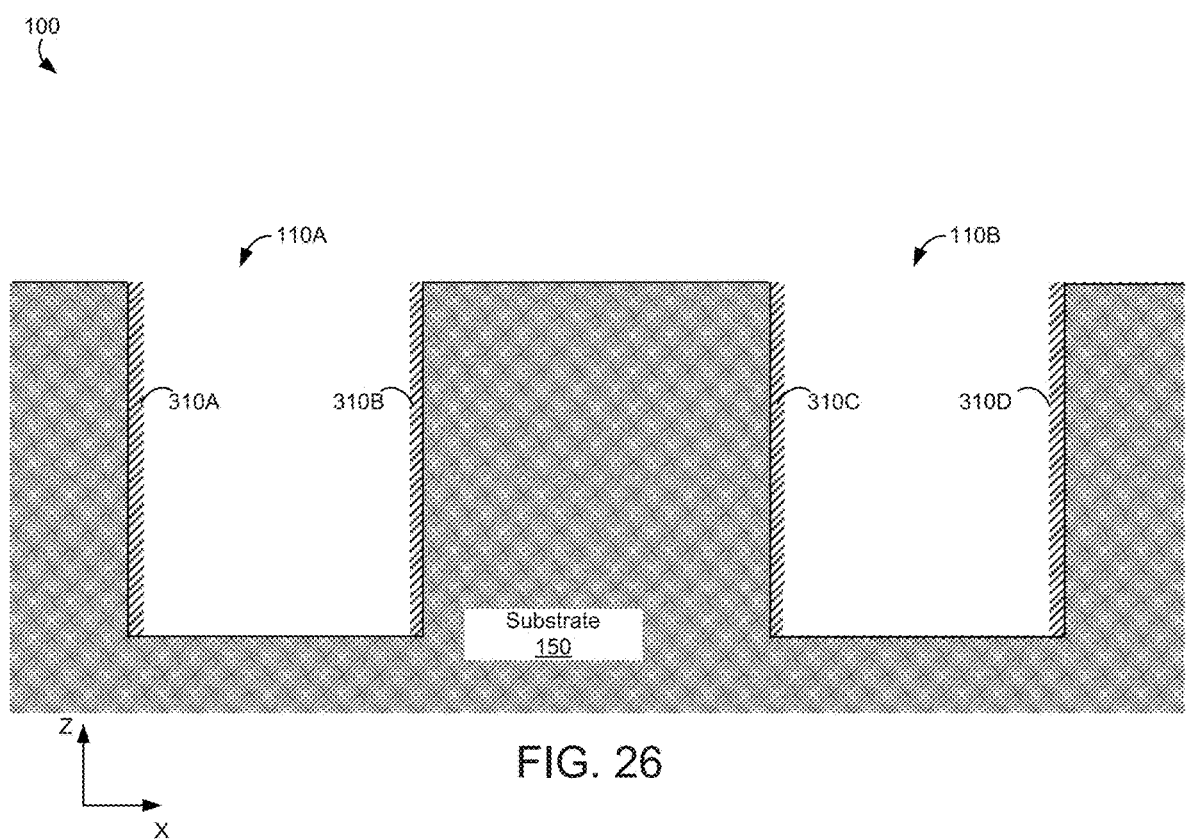
Figure 27:
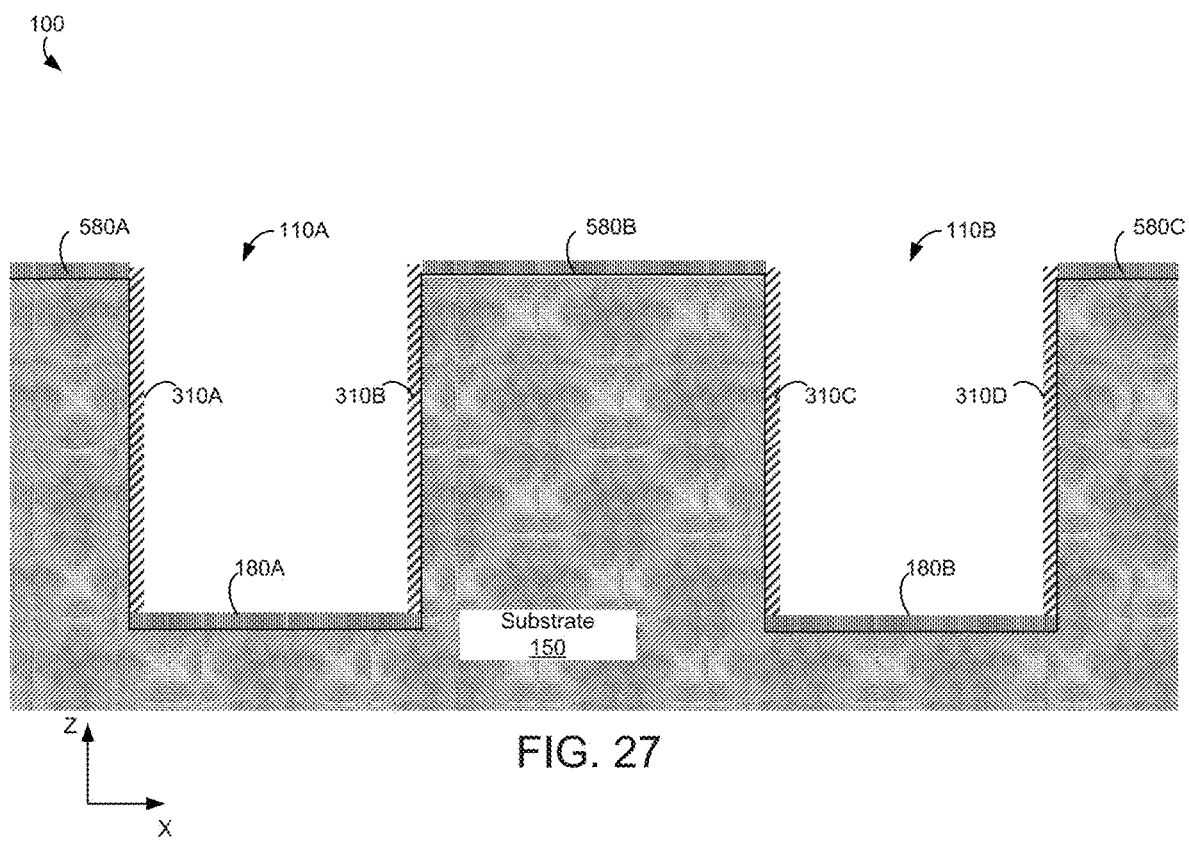
Figure 28:
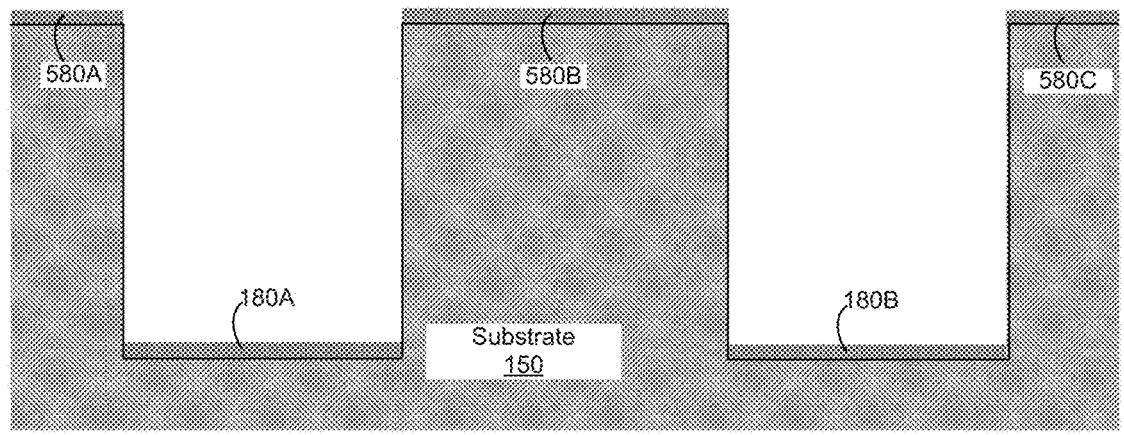

Referring to FIG. 23, illustrated is a top plan view of the device 100, in the next stage 2300 of the process flow. After removing the exposed portions (e.g., dielectric layers 1010A, 1010B, 1010C, 1010D, portions of epitaxial layers 125, and portions of the source/drain structures 192), the photoresist mask 2210 may be removed to obtain the device 100 as shown in FIG. 23. By removing the exposed portions, vertical transistors can have regular structures and consistent characteristics.

In one aspect, the vertical configuration of transistor components in slots 170 can allow a simple connection of different source/drain structures 182 or 192 to form a transistor with an improved characteristic. For example, the source/drain structures 182 in different slots 170 can be connected through metal or a conductive rail extending along the X-direction, and the source/drain structures 192 in different slots 170 can be connected through metal or a conductive rail extending along the X-direction to form a multi-finger transistor. By forming a multi-finger transistor, higher Idsat than Idsat can be achieved.

FIGS. 24-35 show a process of forming an N-type transistor in a first trench 110A and a P-type transistor in a second trench 110B, according to an embodiment. Each of FIGS. 24-35 generally refers to one or more process steps in a process flow, each of which is described in detail in connection with the respective Figure. For the purposes of simplicity and ease of visualization, some reference numbers may be omitted from some Figures. In one aspect, the same processes applied as described with respect to FIGS. 2-9 can be applied to obtain the substrate 150 having trenches 110A, 110B with the dielectric layers 580A, 580B, 580C covering a top surface of the substrate 150 and the dielectric layers 180A, 180B covering the floors of the trenches 110A, 110B as shown in FIGS. 24-28. Thus, detailed description of duplicated portion thereof is omitted herein for the sake of brevity.

Figure 29:
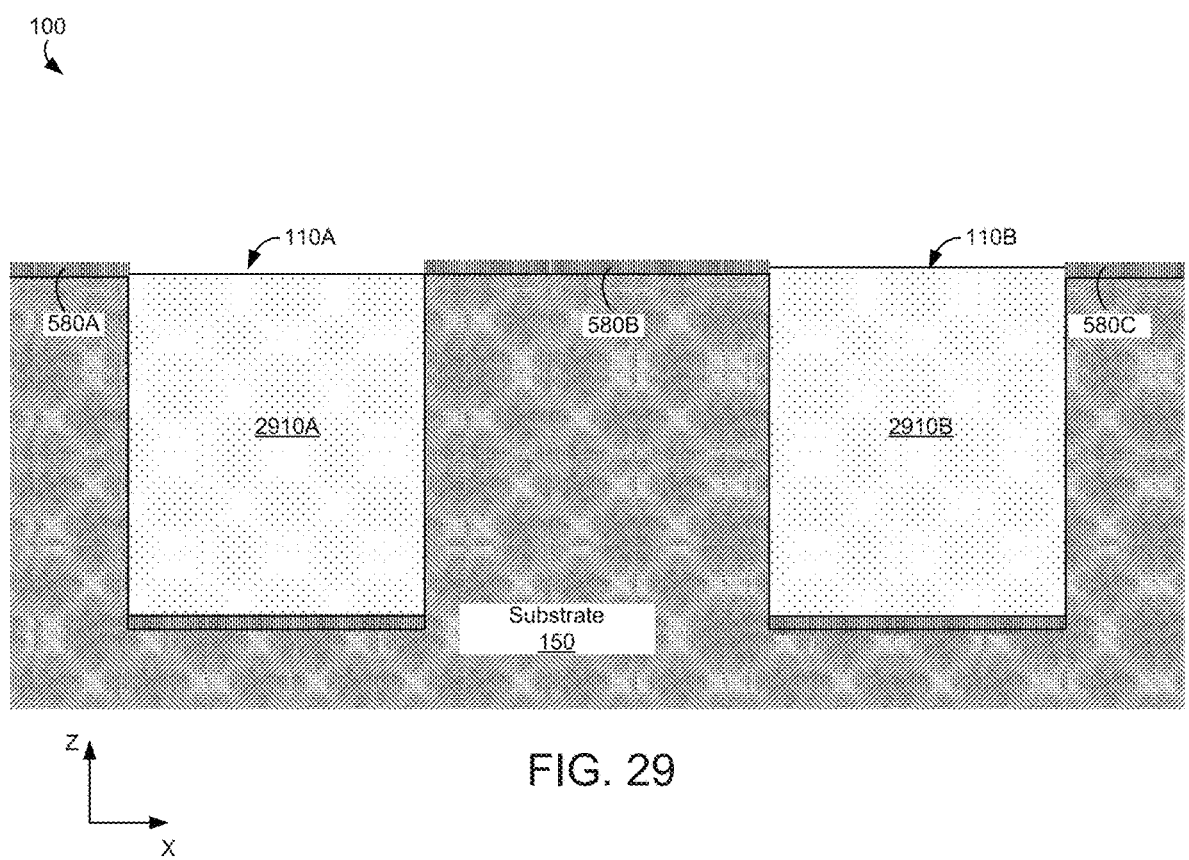

Referring to FIG. 29, illustrated is a cross-sectional view of the device 100, in the next stage 2900 of the process flow. In one aspect, the trenches 110A, 110B can be filled with dielectric layers 2910A, 2910B. The dielectric layers 2910A, 2910B can be formed through a deposition process. The deposition of the dielectric layers 2910A, 2910B can be performed using any type of deposition technique, including but not limited to ALD, CVD, and PVD. A CMP process may be performed such that top surfaces of dielectric layers 2910A, 2910B can be polished.

Figure 30:
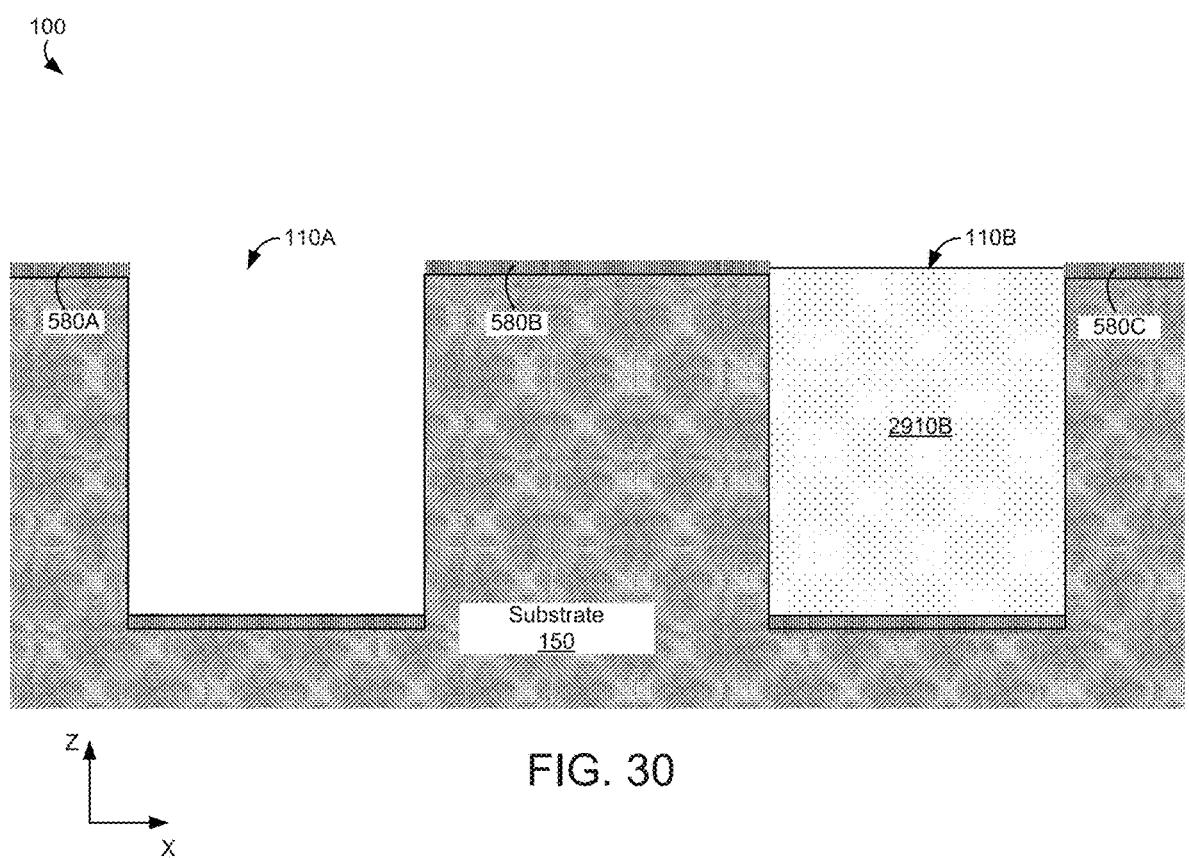

Referring to FIG. 30, illustrated is a cross-sectional view of the device 100, in the next stage 3000 of the process flow. In one aspect, the dielectric layer 2910A in the trench 110A can be removed. The dielectric layer 2910A may be removed through etching. Examples of etching may include dry etching, wet etching, plasma etching, RIE or any etching. For example, a photoresist mask can be placed to cover the dielectric layer 2910B. The photoresist mask may have an opening that exposes the dielectric layer 2910A, such that etching can be applied to remove the dielectric layer 2910A.

Figure 31:
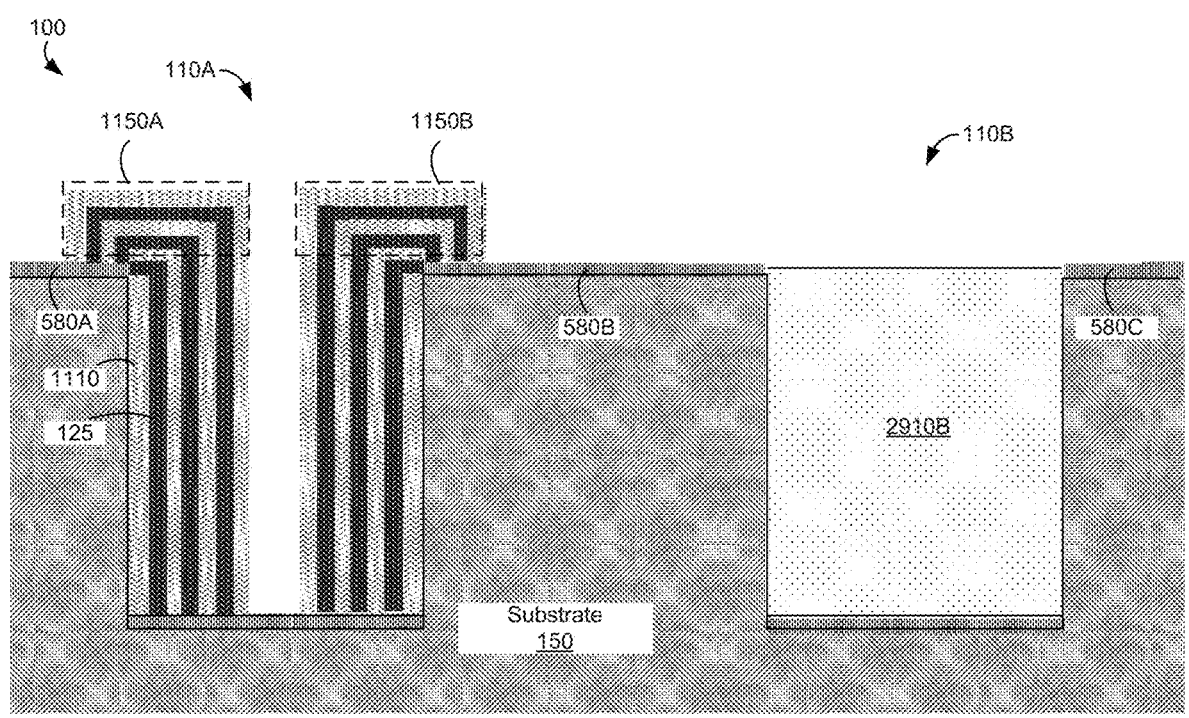

Referring to FIG. 31, illustrated is a cross-sectional view of the device 100, in the next stage 3100 of the process flow. In one aspect, the set of first epitaxial layers 1110 and the set of second epitaxial layers 125 can be formed within the trench 110A, while the trench 110B is filled with the dielectric layer 2910B. The set of first epitaxial layers 1110 may include SiGe, and the set of second epitaxial layers 125 may include SiN+. The set of first epitaxial layers 1110 and the set of second epitaxial layers 125 can be formed within the trench 110A, as described above with respect to FIG. 11. Thus, detailed description of duplicated portion thereof is omitted herein for the sake of brevity.

Figure 32:
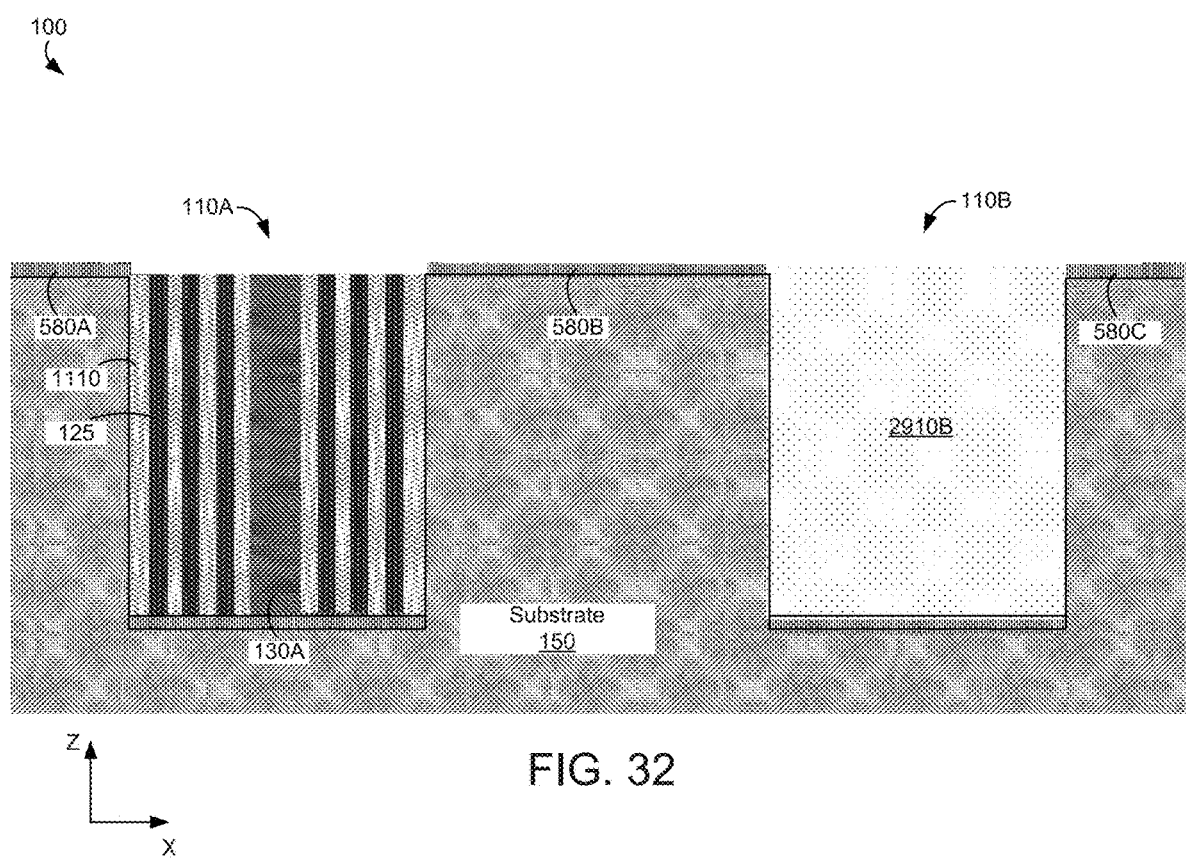

Referring to FIG. 32, illustrated is a cross-sectional view of the device 100, in the next stage 3200 of the process flow. In one aspect, the divider 130A can be formed within the trench 110A, and the excess portions 1150A, 1150B of the set of first epitaxial layers 1110 and the set of second epitaxial layers 125 formed on or over the dielectric layers 580A, 580B can be removed. Forming the divider 130A and removing the excess portions 1150A, 1150B can be performed, as described above with respect to FIG. 12. Thus, detailed description of duplicated portion thereof is omitted herein for the sake of brevity.

Figure 33:
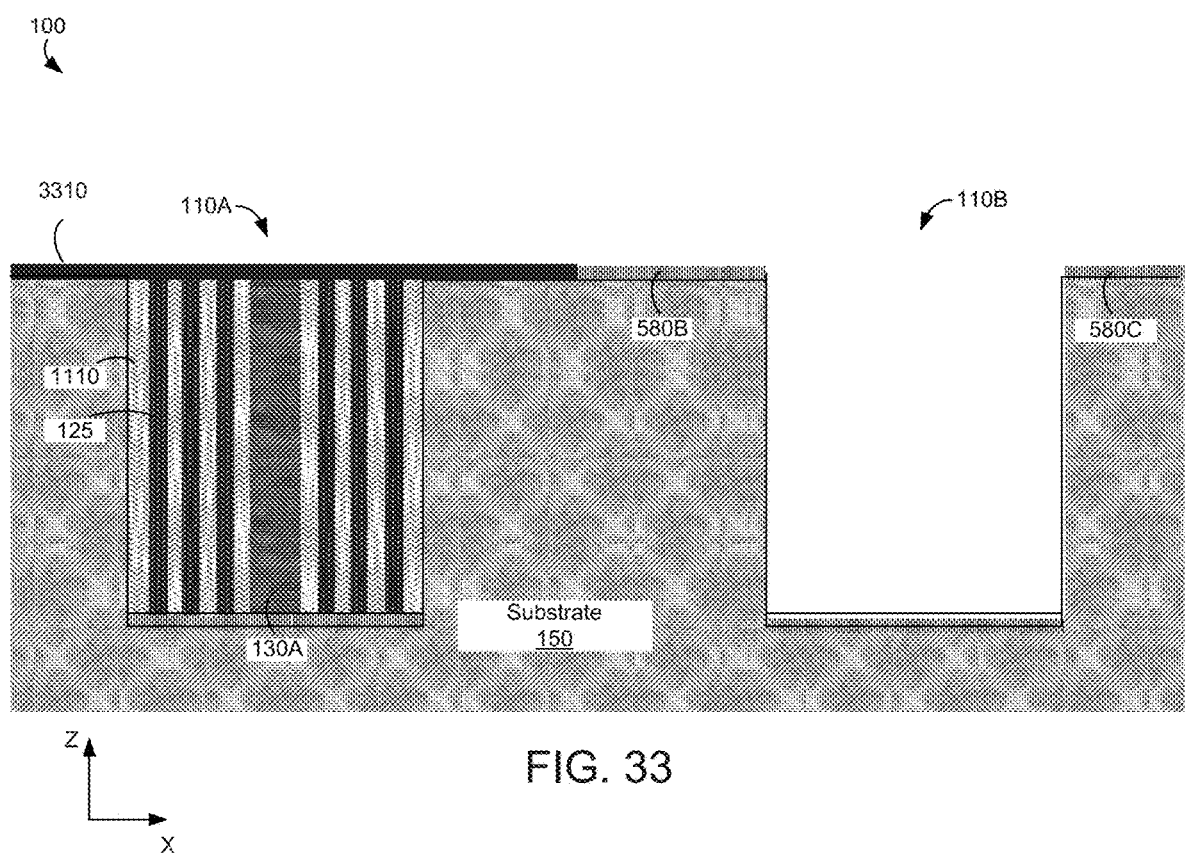

Referring to FIG. 33, illustrated is a cross-sectional view of the device 100, in the next stage 3300 of the process flow. In one aspect, the dielectric layer 580A and a portion of the dielectric layer 580B can be removed through etching. Examples of etching may include dry etching, wet etching, plasma etching, RIE, or any other etching. Then, a capping layer 3310 can be formed on a top surface of the substrate 150 to cover the set of first epitaxial layers 1110, the set of second epitaxial layers 125, and the divider 130A within the trench 110A. After forming the capping layer 3310, the dielectric layer 2910B in the trench 110B can be removed. Examples of etching may include dry etching, wet etching, plasma etching, RIE, or any other etching. The etching may be performed with materials or process reactive to the dielectric layer 580B, but not reactive to the capping layer 3310 and the dielectric layer 580B, 580C, such that the capping layer 3310 and the dielectric layer 580B, 580C may remain unremoved despite the etching. In addition, because the capping layer 3310 covers the set of first epitaxial layers 1110, the set of second epitaxial layers 125, and the divider 130A within the trench 110A may remain unremoved despite the etching.

Figure 34:
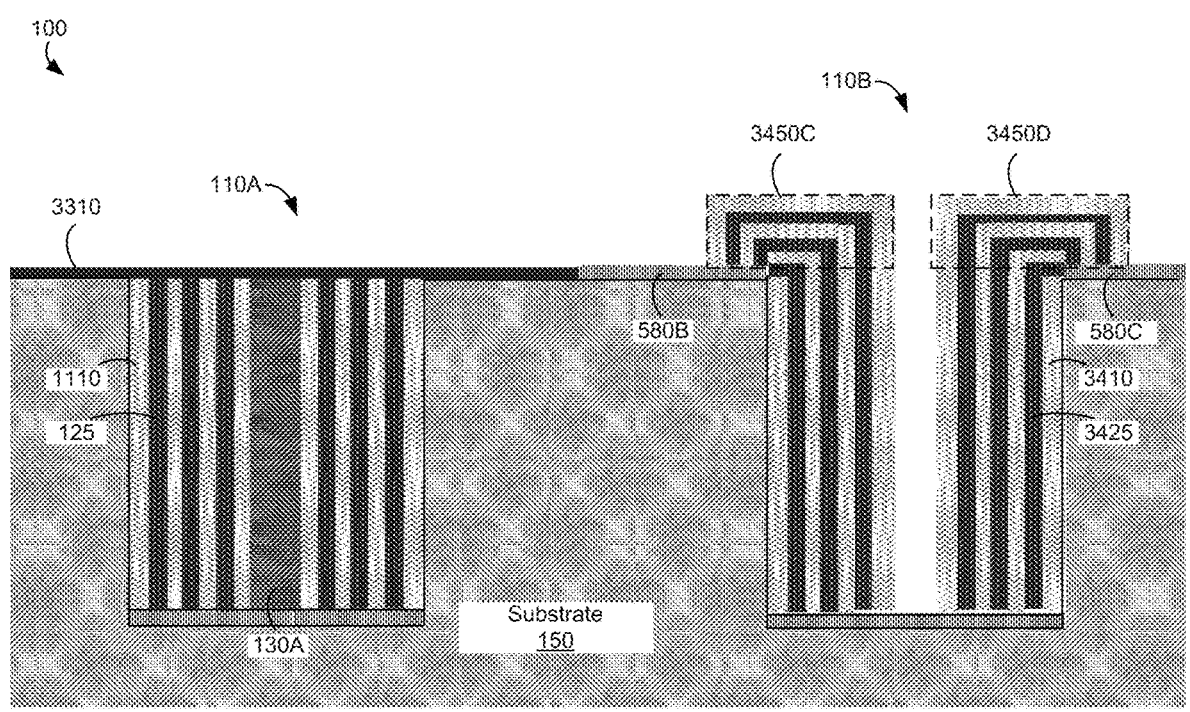

Referring to FIG. 34, illustrated is a cross-sectional view of the device 100, in the next stage 3400 of the process flow. In one aspect, a set of third epitaxial layers 3410 and a set of fourth epitaxial layers 3425 can be formed within the trench 110B. The third epitaxial layers 3410 may include SiGe, and the fourth epitaxial layers 3425 may include SiP+. The set of third epitaxial layers 3410 and the set of fourth epitaxial layer 3425 can be formed in the trench 110B in a similar manner as the set of first epitaxial layers 1110 and the set of second epitaxial layers 125 in the trench 110A, as described above with respect to FIG. 11. Thus, detailed description of duplicated portion thereof is omitted herein for the sake of brevity.

Figure 35:
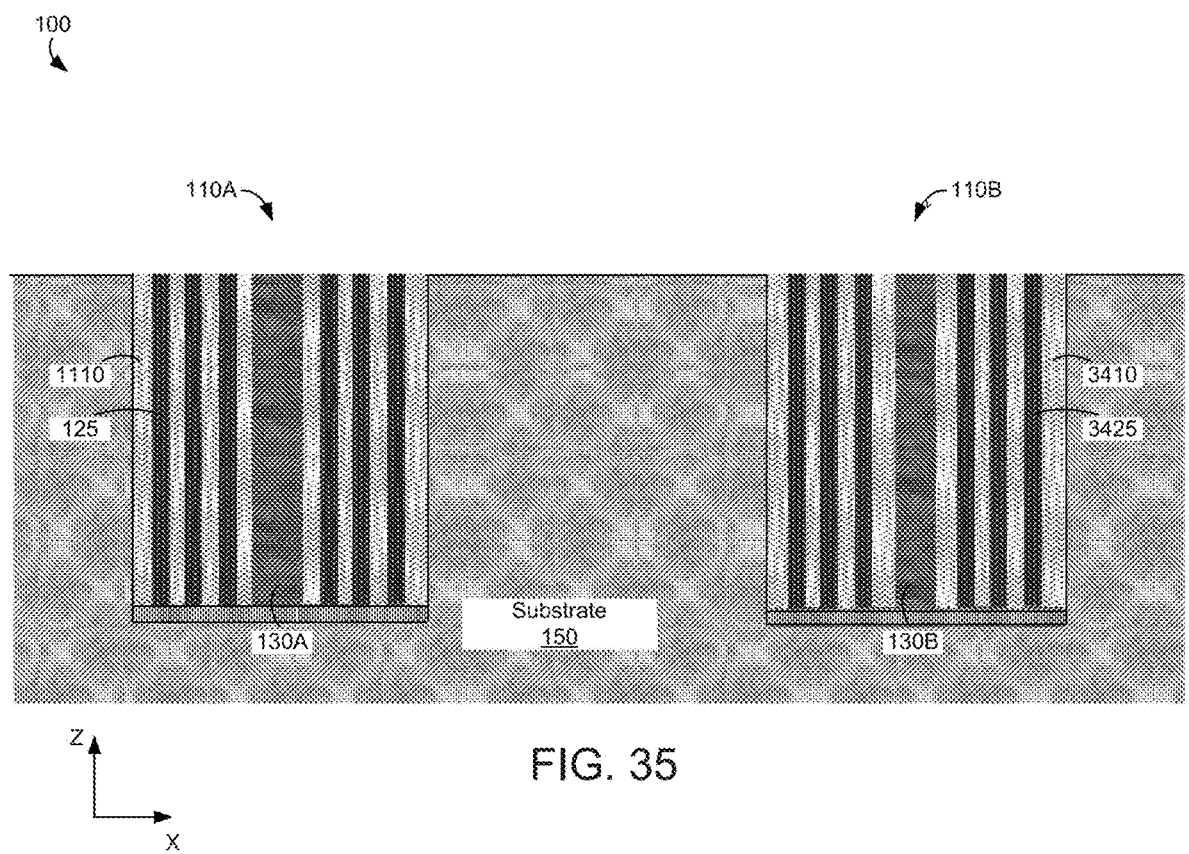

Referring to FIG. 35, illustrated is a cross-sectional view of the device 100, in the next stage 3500 of the process flow. In one aspect, the divider 130B can be formed within the trench 110B, and the excess portions 3450A, 3450B of the set of third epitaxial layers 3410 and the set of fourth epitaxial layers 3425 formed on or over the dielectric layers 580B, 580C (FIG. 34) can be removed. Forming the divider 130B and removing the excess portions 3450A, 3450B can be performed, as described above with respect to FIG. 12. Thus, detailed description of duplicated portion thereof is omitted herein for the sake of brevity. Moreover, dielectric layers 580B, 580C and the capping layer 3310 on the top surface of the substrate 150 can be removed through etching. Examples of etching may include dry etching, wet etching, plasma etching, RIE, or any other etching. A CMP process may be performed such that the top surface of the substrate 150, edges of the epitaxial layers 1110, 125, 3410, 3425, and the dividers 130A, 130B can have a flushed surface.

Figure 36:
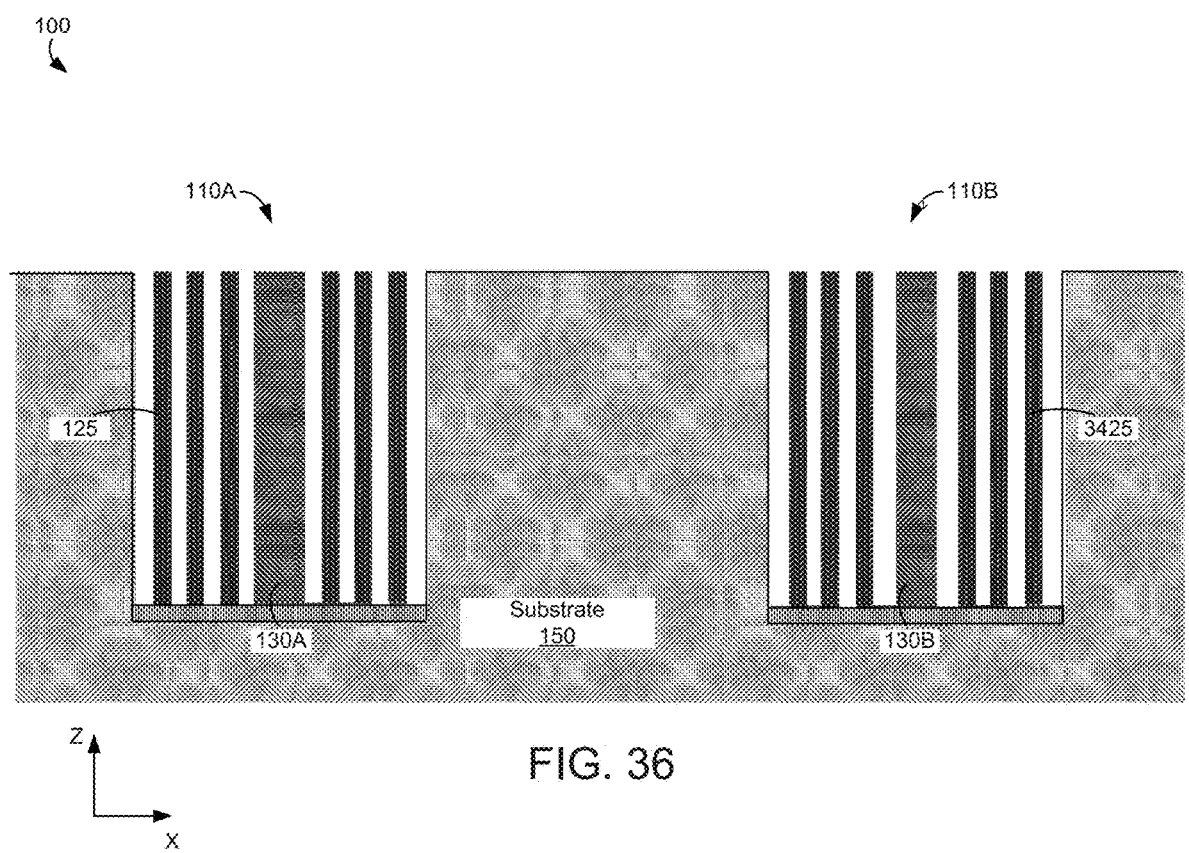

Referring to FIG. 36, illustrated is a cross-sectional view of the device 100, in the next stage 3600 of the process flow. In one aspect, the set of first epitaxial layers 1110 (FIG. 35) in the trench 110A and the set of third epitaxial layers 3410 (FIG. 34) in the trench 110B can be removed through etching. The set of first epitaxial layers 1110 in the trench 110A and the set of third epitaxial layers 3410 in the trench 110B can be removed, as described above with respect to FIG. 13. Thus, detailed description of duplicated portion thereof is omitted herein for the sake of brevity. In one aspect, the epitaxial layers 1110 in the trench 110A and the epitaxial layers 3410 in the trench 110B may have the same materials (e.g., SiGe), such that the epitaxial layers 1110, 3410 can be removed through a single etching process. By removing the set of first epitaxial layers 1110 and the set of third epitaxial layers 3410, narrow slots 170 can be formed in the trenches 110A, 110B, and also described with respect to FIG. 13.

Figure 37:
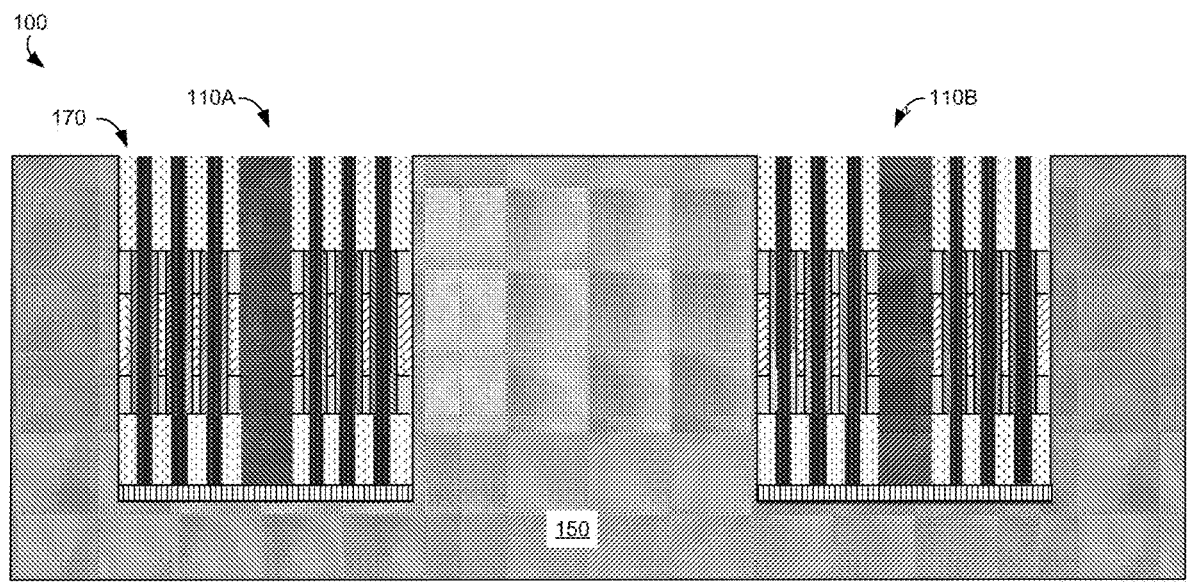

Referring to FIG. 37, illustrated is a cross-sectional view of the device 100, in the next stage 3700 of the process flow. In one aspect, N-type transistors can be formed in slots 170 within the trench 110A, where P-type transistors can be formed in slots 170 within the trench 110B. The transistors in the slots 170 can be formed through the similar process as described above with respect to FIGS. 14-24, except source/drain structures and gate dielectric regions formed in the trench 110B may have different materials than source/drain structures and gate dielectric regions formed in the trench 110A. Thus, detailed description of duplicated portion thereof is omitted herein for the sake of brevity.

Figure 38:
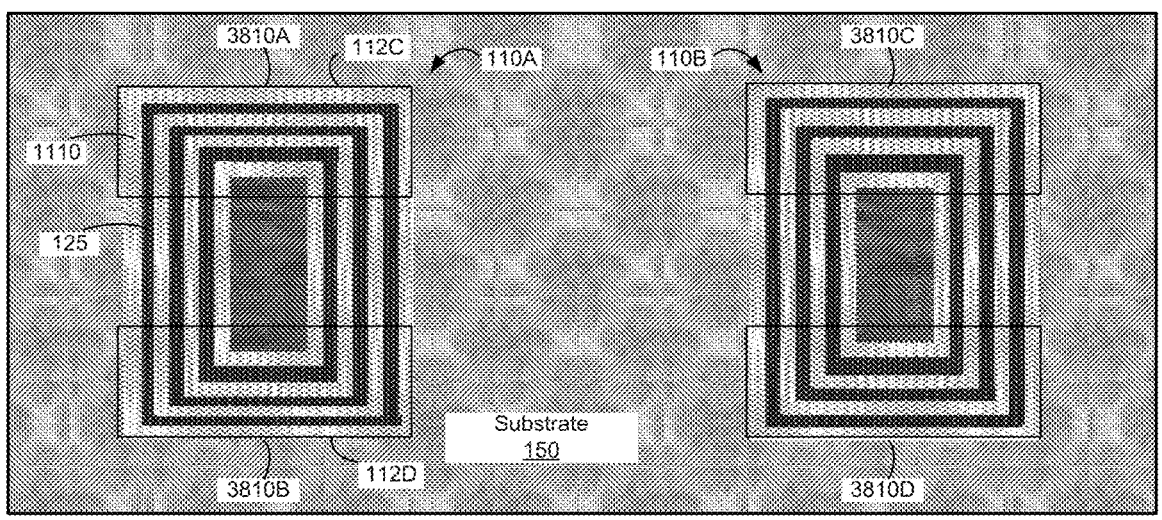
FIGS. 38-40 show top plan views of a process to form vertical transistors, according to an embodiment.
Figure 39:
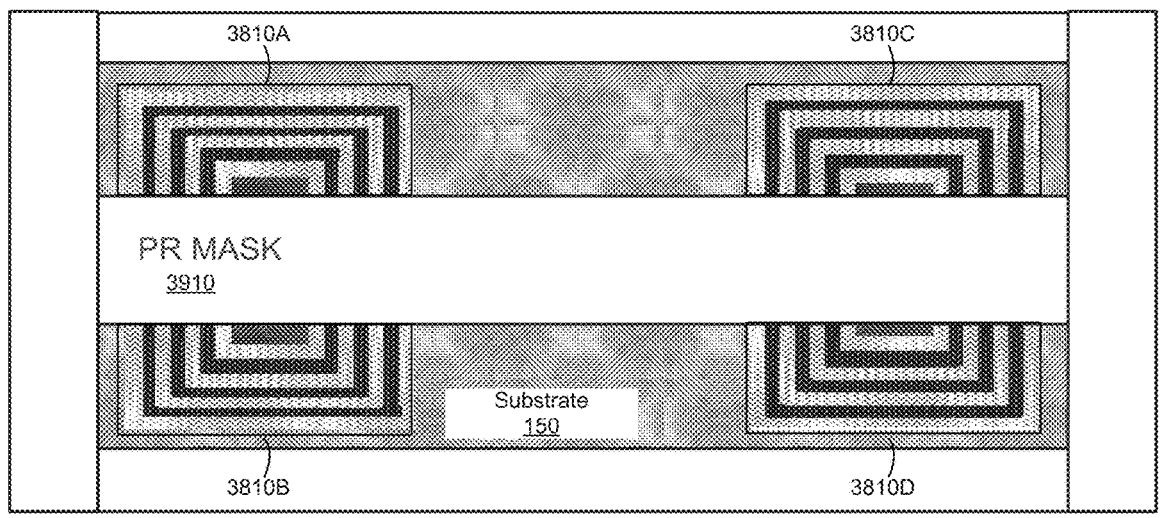
Figure 39:
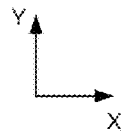
Figure 40:
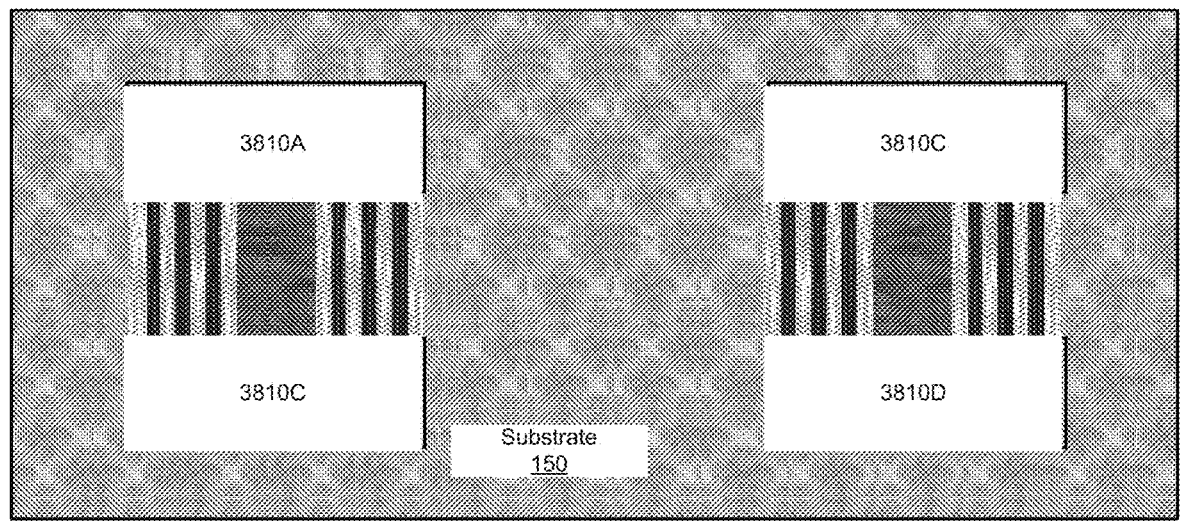
Figure 40:
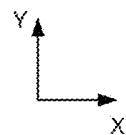

FIGS. 38-40 show top plan views of a process to form vertical transistors without the dielectric layers 1010A-1010D, according to an embodiment. Referring to FIG. 38, illustrated is a top plan view of the device 100 after forming the set of first epitaxial layers 1110 and the set of second epitaxial layers 125 without the dielectric layers 1010A-1010D at one stage 3800 of a process flow, according to an embodiment. As described with respect to FIGS. 13-23, vertical transistors can be formed in slots 170 by removing the set of first epitaxial layers 1110. However, without the dielectric layers 1010A-1010D on the sidewalls 112C, 112D, if the set of first epitaxial layers 1110 and the set of epitaxial layer 125 are epitaxially grown, the set of first epitaxial layers 1110 and the set of second epitaxial layers 125 may be formed to also extend along the X-direction in regions 3810A-3810D, as shown in FIG. 38. Transistor components formed along the X-direction may cause irregularity and affect performance of the transistors. To obtain regular structures of the transistors with consistent characteristics, epitaxial layers or transistor components in the regions 3810A-3810D can be removed. For example, in the next stage 3900 of the process flow as shown in FIG. 39, a photoresist mask 3910 exposing the regions 3810A-3810D can be applied on the top surface of the substrate 150, such that epitaxial layers or transistor components in the regions 3810A-3810D can be removed by etching. By removing the epitaxial layers or transistor components in the regions 3810A-3810D, transistor components in the remaining portion can have a regular or uniform configuration in the next stage 4000 of the process flow as shown in FIG. 40. In one aspect, forming vertical transistors through the process as shown in FIGS. 38-40 may render an inefficient usage of resources or area, because a large area of the regions 3810A-3810D are discarded. Meanwhile, the fabrication process can be simplified, because the process of forming the dielectric layers 1010A-1010D can be omitted. It should be understood, however, that efficiency may be increased by stretching the trenches such that many nano sheets, such as 1000, may be formed.

Figure 41:
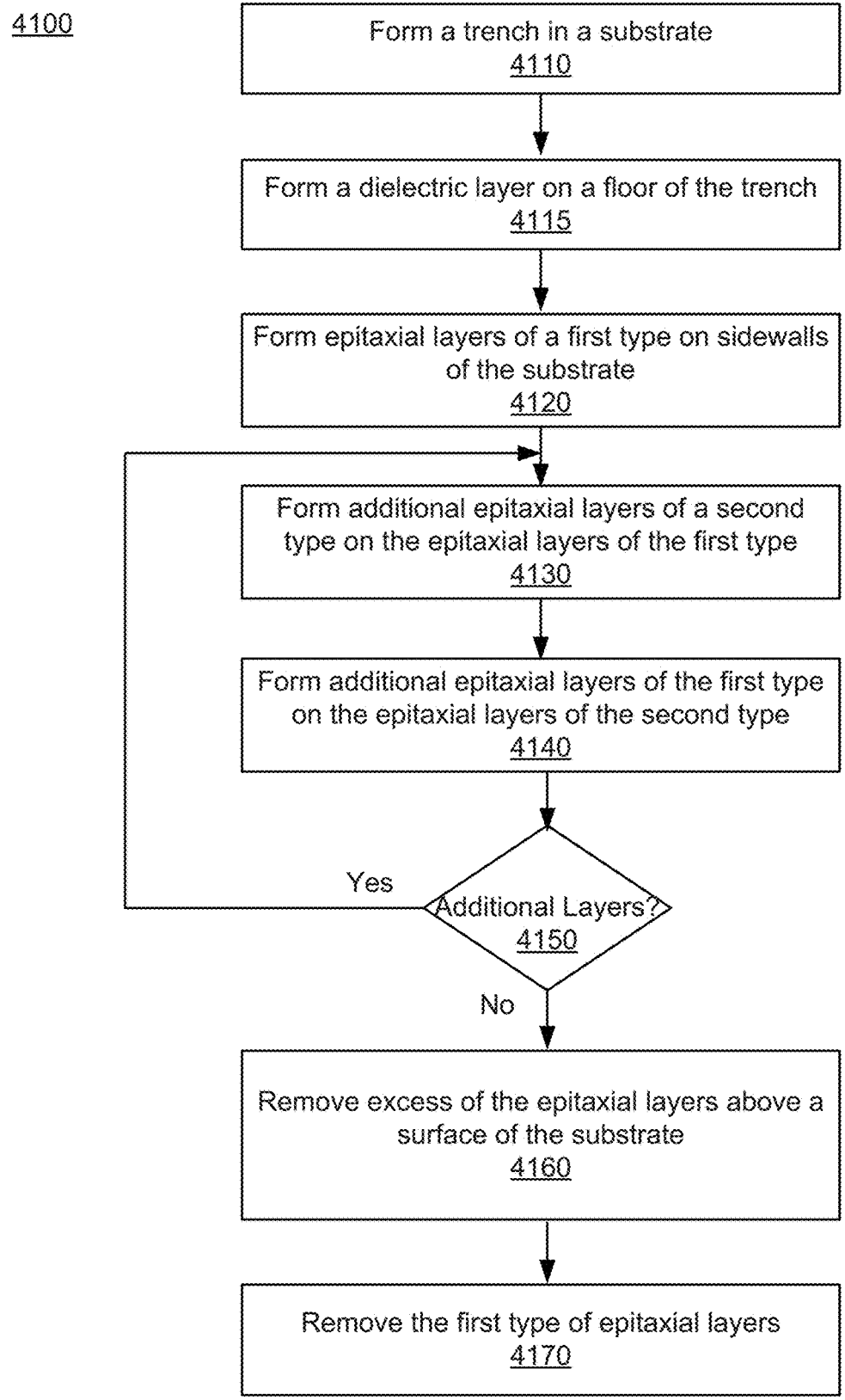
FIG. 41 is a flow chart showing a process of forming vertical slots within a trench, according to an embodiment.

Referring now to FIG. 41, illustrated is a flow diagram of a process 4100 for forming vertical slots 170 within a trench 110. The process 4100 can be performed by a fabrication facility or a fabrication device. The process 4100 may include steps 4110-4170. However, other embodiments may include additional or alternative steps, or may omit one or more steps altogether.

At step 4110, the process 4100 can include forming a trench 110 in a substrate 150. Forming the trench 110 can be performed, as described above with respect to FIG. 2. For example, a photoresist mask 210 may be placed on a top surface of the substrate 150. The photoresist mask 210 may have openings or exposures corresponding to areas of trenches 110A, 110B, such that portions of the substrate 150 can be exposed. The exposed portions of the substrate 150 can be etched to form the trenches 110A, 110B. Each trench 110 may be defined by sidewalls 112 and a floor 118 adjoining ends of the sidewalls 112.

At step 4115, after forming the trench 110, a dielectric layer 180 can be formed on the floor 118 of the trench 110. Forming the dielectric layer 180 on the floor 118 can be performed, as described above with respect to FIG. 5. For example, the dielectric layer 180 can be formed through deposition. The deposition of the dielectric layer 180 can be performed using any type of deposition technique, including but not limited to ALD, CVD, and PVD. The dielectric layer 180 may prevent growth of epitaxial layers on the floor 118 of the trench 110.

In some embodiments, dielectric layers 1010A-1010D can be formed to prevent growth of epitaxial layers on the sidewalls 112C, 112D facing each other along the Y-direction, as described above with respect to FIGS. 3-11 or as described below with respect to FIG. 42. Forming the dielectric layers 1010A-1010D may allow epitaxial layers 1110, 125 to be stacked within the trench 110 in a controlled direction (e.g., X-direction).

At step 4120, the process 4100 can include forming epitaxial layers 1110 of a first type on sidewalls 112A, 112B of the substrate 150 facing each other along the X-direction. The epitaxial layers 1110 of the first type may include SiGe. The epitaxial layers 1110 may be grown on the sidewalls 112A, 112B to form a plane extending along the Z-direction and the Y-direction.

At step 4130, the process 4100 can include forming epitaxial layers 125 of a second type on the epitaxial layers 1110 of the first type. The epitaxial layers 125 of the second type may include Si, SiN+, SiP+. The epitaxial layers 125 of the second type may be grown on the epitaxial layers 1110 of the first type to form a plane extending along the Z-direction and the Y-direction, such that the epitaxial layers 1110, 125 may be stacked along the X-direction within the trench 110.

At step 4140, the process 4100 can include forming additional epitaxial layers 1110 of the first type on the epitaxial layers 125 of the second type. The additional epitaxial layers 1110 of the first type may be grown on the epitaxial layers 125 of the first type to form a plane extending along the Z-direction and the Y-direction, such that the epitaxial layers 1110, 125 may be stacked along the X-direction within the trench 110. Forming the epitaxial layers 1110 of the first type and the epitaxial layers 125 of the second type may be performed as described above with respect to FIG. 11.

At step 4150, the process 4100 can include determining whether additional epitaxial layers 1110, 125 should be formed. For example, if the number of epitaxial layers 1110, 125 formed within the trench 110 is less than a target number or a predetermined number of epitaxial layers 1110, 125 to have in the trench 110, then it can be determined that additional epitaxial layers 1110, 125 should be formed. For example, if the number of epitaxial layers 1110, 125 formed within the trench 110 is equal to the target number or the predetermined number of epitaxial layers 1110, 125 to have in the trench 110, then it can be determined that no additional epitaxial layers 1110, 125 should be formed. For example, a clearance or spacing within the trench 110 along the X-direction after the step 4140 can be determined, and if the clearance or spacing is sufficient to accommodate additional epitaxial layers 1110, 125 and a divider 130, then it can be determined that additional epitaxial layers 1110, 125 should be formed. For example, if the clearance or spacing is insufficient to accommodate additional epitaxial layers 1110, 125 and the divider 130, then it can be determined that no additional epitaxial layers 1110, 125 should be formed. In response to determining that additional epitaxial layers should be formed, the process 4100 may proceed to the step 4130 to form the additional epitaxial layers 1110, 125.

At step 4160, in response to determining that no additional epitaxial layers should be formed, the process 4100 can include removing excess of the epitaxial layers 1110, 125 above the top surface of the substrate 150. Removing the excess of the epitaxial layers 1110, 125 above the top surface of the substrate 150 may be performed, as described above with respect to FIG. 12. For example, the portions 1150A-1150D of the set of first epitaxial layers 1110 and the set of second epitaxial layers 125 may be removed through etching. Examples of etching may include dry etching, wet etching, plasma etching, RIE or any etching. A CMP process may be performed such that the top surface of the substrate 150 and edges of the epitaxial layers 1110, 125 can have a flushed surface.

In some embodiments, a divider 130 can be formed in each trench 110. The divider 130 can be formed by depositing dielectric materials in a remaining space within the trench 110. The dividers 130A, 130B may include a dielectric. The divider 130 may operate as an insulator to separate a space within the trench 110A into two regions 145A, 145B. The deposition of the divider 130 can be performed using any type of deposition technique, including but not limited to ALD, CVD, and PVD.

At step 4170, the process 4100 can include removing the epitaxial layers 1110 of the first type. The epitaxial layers 1110 can be removed, as described above with respect to FIG. 13. For example, the epitaxial layers 1110 can be removed through etching. Etching can be performed with materials or a process reactive to materials of the set of first epitaxial layers 1110 but not reactive to materials of the set of second epitaxial layers 125, the dividers 130, and the dielectric layers 180A, 180B. Accordingly, the set of epitaxial layers 1110 can be removed to form narrow spaces or slots 170. In one aspect, vertical semiconductor devices (e.g., transistors, resistors, capacitors, diode, etc.) can be formed in each slot 170 with high density.

Figure 42:
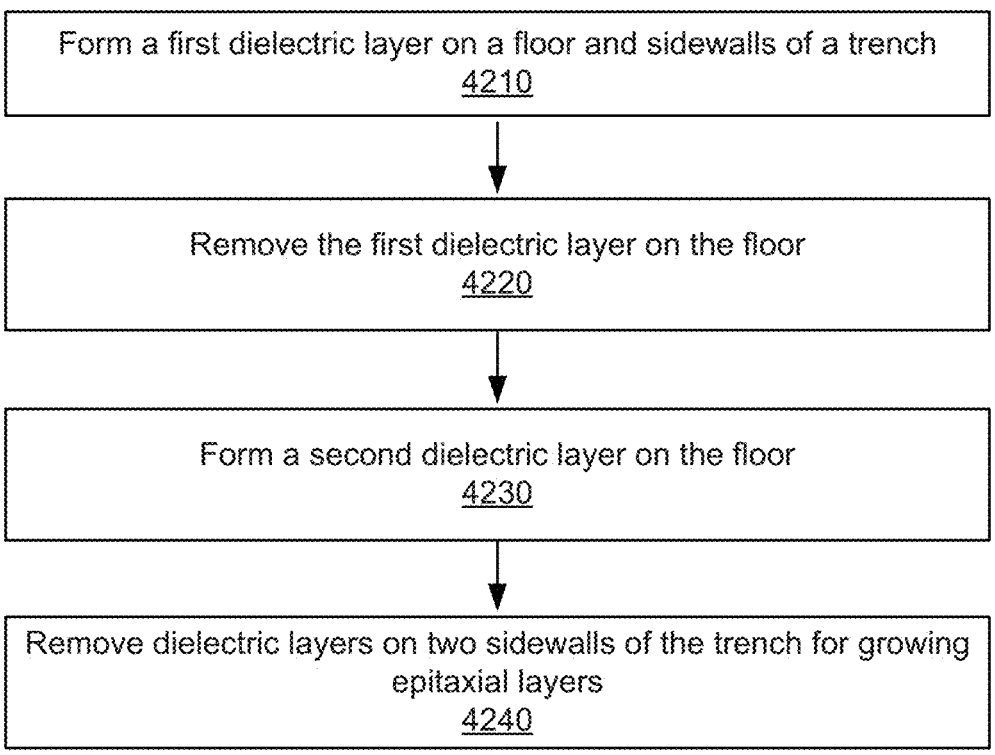
FIG. 42 is a flow chart showing a process of preparing a trench for growing epitaxial layers along a direction, according to an embodiment.

Referring now to FIG. 42, illustrated is a flow chart showing a process 4200 of preparing a trench 110 for growing epitaxial layers along a direction (e.g., X-direction), according to an embodiment. The process 4200 can be performed by a fabrication facility or a fabrication device. The process 4200 may be performed in conjunction with or as part of the step 4115 in FIG. 41. The process 4200 may include steps 4210-4240. However, other embodiments may include additional or alternative steps, or may omit one or more steps altogether.

At step 4210, the process 4200 may include forming a dielectric layer on a floor and sidewalls of a trench 110. The dielectric layer may include dielectric layers 310A-310D on sidewalls 112 of the trenches 110 and dielectric layers 330A, 330B on the floors of the trenches 110. The dielectric layers 310A-310D, 330A, 330B may be formed in the trenches 110, as described above with respect to FIG. 3. For example, a contiguous dielectric layer including dielectric layers 310A-310D, 320A-320C, 330A, 330B may be deposit on the substrate 150, as shown in FIG. 3. The dielectric layers 330A, 330B can be formed on the floors of the trenches 110A, 110B; the dielectric layers 310A, 310B, 310C, 310D can be formed on the sidewalls (e.g., 112A, 112B) of the trenches 110A, 110B facing each other along the X-direction; and the dielectric layers 320A, 320B, 320C can be formed on non-etched or non-trenched portions of the top surface of the substrate 150. Additional dielectric layers can be formed on other side walls (e.g., 112C, 112D) of the trenches 110A, 110B facing each other along the Y-direction. The deposition of dielectric layers can be performed using any type of deposition technique, including but not limited to ALD, CVD, and PVD.

At step 4220, the process 4200 may include removing the dielectric layers 330A, 330B on the floors 118 of the trenches 110. The dielectric layers 330A, 330B on the floors 118 of the trenches 110A, 110B can be removed, as described above with respect to FIG. 4. For example, the dielectric layers 320A-320C on the top surface of the substrate 150 and the dielectric layers 330A, 330B on the floors of the trenches 110A, 110B can be removed through etching. Examples of etching may include dry etching, wet etching, plasma etching, reactive ion etching (ME). The etching may be performed in a manner that the dielectric layers 320A, 320B, 320C on the sidewalls 112 of the trenches 110 can remain unremoved.

At step 4230, the process 4200 may include forming dielectric layers 180 on the floors 118 of the trenches 110. The dielectric layers 180 can be formed on the floors 118 of the trenches 110A, 110B, as described above with respect to FIG. 5. For example, the dielectric layers 580A-580C can be formed on the top surface of the substrate 150, and the dielectric layers 180A, 180B can be formed on the floors of the trenches 110A, 110B. In one aspect, the dielectric layers 180A, 180B can prevent growth of epitaxial layers on the floors 118 of the trenches 110A, 110B. The dielectric layers 180A, 180B, 580A-580C can be formed through deposition. The deposition of the dielectric layers 180A, 180B, 580A-580C can be performed using any type of deposition technique, including but not limited to ALD, CVD, and PVD.

At step 4240, the process 4200 may include removing portions of dielectric layers 310A, 310B, 310C, 310D on two sidewalls 112A, 112B of the trench 110 facing each other along the X-direction. Removing the portions of dielectric layers 310A, 310B, 310C, 310D may be performed by providing one or more photoresist masks 620A, 620B to protect dielectric layers on sidewalls 112C, 112D of the trench 110 facing each other along the Y-direction while exposing regions corresponding to the portions of dielectric layers 310A, 310B, 310C, 310D, as described above with respect to FIG. 6. After covering the dielectric layers on sidewalls 112C, 112D of the trench 110 facing each other along the Y-direction, etching can be performed to remove the portions of dielectric layers 310A, 310B, 310C, 310D on two sidewalls 112A, 112B of the trench 110 facing each other along the X-direction, as described above with respect to FIGS. 7-10. After performing the etching, the photoresist masks 620A, 620B may be removed, such that dielectric layers 1010A-1010D can be exposed. Each dielectric layer 1010 may include dielectric layer on the sidewall (e.g., 112C, 112D) facing along the Y-direction and the protected portions of the dielectric layers 310A-310D on the sidewalls (e.g., 112A, 112B) to form a "U" shape as shown in FIG. 10.

In one aspect, the dielectric layers 1010A-1010D may prevent growth of epitaxial layers on sidewalls (e.g., 112C, 112D) facing along the Y-direction. By preventing growth of epitaxial layers on sidewalls (e.g., 112C, 112D) facing along the Y-direction, areas or regions 3810A-3810D discarded as shown in FIGS. 38-40 can be obviated or minimized to achieve area efficiency.

Figure 43:
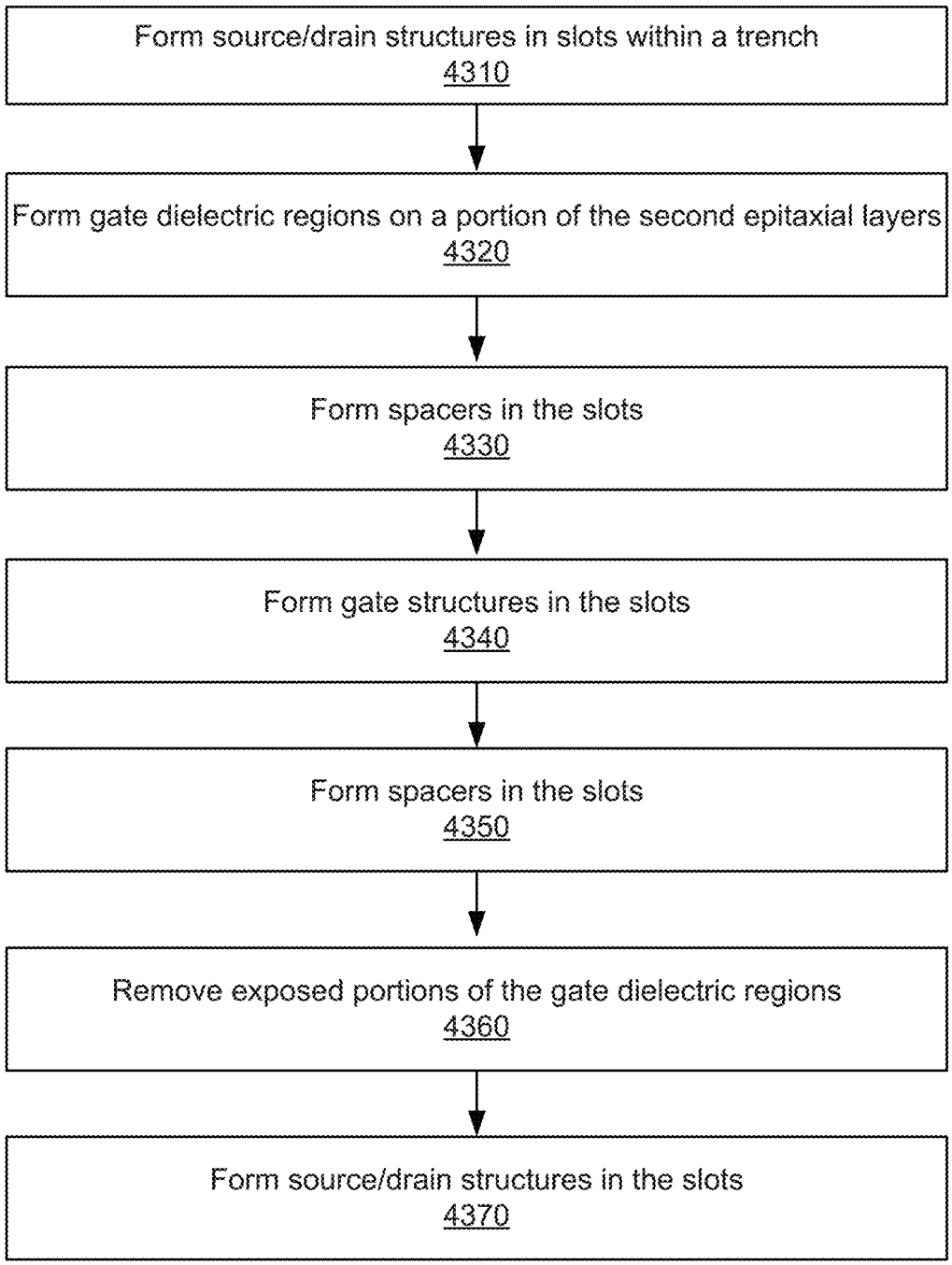
FIG. 43 is a flow chart showing a process of forming vertical transistors in slots within a trench, according to an embodiment.

Referring now to FIG. 43, illustrated is a flow chart showing a process 4300 of forming vertical transistors in slots 170 within a trench 110, according to an embodiment. The process 4300 can be performed by a fabrication facility or a fabrication device. The process 4300 may be performed after the step 4170 in FIG. 41. The process 4300 may include steps 4310-4370. However, other embodiments may include additional or alternative steps, or may omit one or more steps altogether.

At step 4310, the process 4300 may include forming source/drain structures 182 in slots 170 within a trench 110. The source/drain structures 182 may be formed in the slots 170, as described above with respect to FIG. 14. For example, the source/drain structures 182 can be formed through a deposition process by filling a bottom portion of each slot 170. The deposition of the source/drain structures 182 can be performed using any type of deposition technique, including but not limited to ALD, CVD, and PVD.

At step 4320, the process 4300 may include forming gate dielectric regions 188 on portions of the second epitaxial layers 125. The gate dielectric regions 188 may be formed on the portions of the second epitaxial layers 125, as described above with respect to FIG. 15. For example, after forming the source/drain structures 182, the gate dielectric regions 188 can be formed on the exposed portions of the set of second epitaxial layers 125, such that the gate dielectric regions 188 may extend along the Y-direction. The gate dielectric regions 188 may include high-k dielectric materials such as $Si_3N_4$, $Al_2O_3$, $Ta_2O_5$, $TiO_2$, $ZrO_2$, and $HfO_2$. The gate dielectric regions 188 may be formed through a deposition process. The deposition of the gate dielectric regions 188 can be performed using any type of deposition technique, including but not limited to ALD, CVD, and PVD. In one aspect, a thickness of each gate dielectric region 188 along the X-direction may be less than a thickness of the source/drain structure 182 along the X-direction, such that a space can exist in each slot 170.

At step 4330, the process 4300 may include forming spacers 184 in the slots 170. The spacers 184 may be formed in the slots 170, as described above with respect to FIG. 16. For example, after forming the gate dielectric regions 188, the spacers 184 can be formed on the source/drain structures 182, through a deposition process by filling a bottom portion of a remaining space in each slot 170. The deposition of the spacers 184 can be performed using any type of deposition technique, including but not limited to ALD, CVD, and PVD. The spacers 184 may operate as insulators.

At step 4340, the process 4300 may include forming gate structures 186 in the slots 170. The gate structures 186 may be formed in the slots 170, as described above with respect to FIG. 17. For example, after forming the spacers 184, gate structures 186 can be formed on the spacers 184, through a deposition process by filling a bottom portion of a remaining space in each slot 170. The deposition of the gate structures 186 can be performed using any type of deposition technique, including but not limited to ALD, CVD, and PVD.

At step 4350, the process 4300 may include forming spacers 190 in the slots 170. The spacers 190 may be formed in the slots 170, as described above with respect to FIG. 18. For example, after forming the gate structures 186, additional spacers 190 can be formed on the gate structures 186. The spacers 190 can be formed through a deposition process by filling a bottom portion of a remaining space in each slot 170. The deposition of the spacers 190 can be performed using any type of deposition technique, including but not limited to ALD, CVD, and PVD.

At step 4360, the process 4300 may include removing exposed portions of the gate dielectric regions 188. The exposed portions of the gate dielectric regions 188 can be removed, as described above with respect to FIG. 19. For example, after forming the spacers 190, exposed portions of the gate dielectric regions 188 can be removed through etching. Examples of etching may include dry etching, wet etching, plasma etching, RIE or any etching.

At step 4370, the process 4300 may include forming source/drain structures 192 in the slots 170. The source/drain structures 192 can be formed in the slots 170, as described above with respect to FIG. 20. For example, after removing the exposed portions of the gate dielectric regions 188, additional source/drain structures 192 can be formed through a deposition process by filling a remaining portion of each slot 170. The deposition of the source/drain structures 192 can be performed using any type of deposition technique, including but not limited to ALD, CVD, and PVD. After forming the source/drain structures 182, CMP process can be performed, such that edges of the source/drain structures 182 and the top surface of the substrate 150 can have a flushed surface.

By forming vertical transistors in narrow slots 170 as described herein, a large number of transistors can be formed in a compact area corresponding to the slots 170 to achieve area efficiency. Moreover, the vertical configuration of transistors in slots 170 can allow a simple connection to connect different source/drain structures 182 or 192. For example, the source/drain structures 182 in different slots 170 can be connected through metal or a conductive rail extending along the X-direction, and the source/drain structures 192 in different slots 170 can be connected through metal or a conductive rail extending along the X-direction to form a multi-finger transistor. It should be understood that N vertical nano sheets (i.e., epitaxial layers 125) may be connected (i.e., at source/drain and channel regions) to achieve a desired transistor Idsat to meet circuit specifications. By forming a multi-finger transistor, higher Idsat than Idsat can be achieved.

Having now described some illustrative implementations and implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features discussed only in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

"Substrate" or "target substrate" may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation, and references to "an implementation," "some implementations," "an alternate implementation," "various implementation," "one implementation" or the like are not necessarily mutually exclusive and are intended to indicate that a particular feature, structure, or characteristic described in connection with the implementation may be included in at least one implementation. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms.

Where technical features in the drawings, detailed description or any claim are followed by reference signs, the reference signs have been included for the sole purpose of increasing the intelligibility of the drawings, detailed description, and claims. Accordingly, neither the reference signs nor their absence have any limiting effect on the scope of any claim elements.

The preceding description of the disclosed embodiments is provided to enable any person skilled in the art to make or use the embodiments described herein and variations thereof. Various modifications to these embodiments will be readily apparent to those skilled in the art, and the principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A method comprising:
   forming a trench in a substrate, the trench defined by a first sidewall and a second sidewall facing each other along a first direction and a floor between one end of the first sidewall and one end of the second sidewall;
   forming a dielectric layer on the floor;
   forming a first epitaxial layer on the first sidewall along a second direction traversing the first direction;
   forming a second epitaxial layer on the second sidewall along the second direction, the first epitaxial layer and the second epitaxial layer being a first type;
   forming a third epitaxial layer on the first epitaxial layer along the second direction; and
   forming a fourth epitaxial layer on the second epitaxial layer along the second direction, the third epitaxial layer and the fourth epitaxial layer being a second type.

2. The method of claim 1, wherein the first epitaxial layer, the second epitaxial layer, the third epitaxial layer, and the fourth epitaxial layer extend from the dielectric layer along the second direction.

3. The method of claim 1, wherein the first epitaxial layer and the second epitaxial layer include SiGe and wherein the third epitaxial layer and the fourth epitaxial layer include Si, SiN+, or SiP+.

4. The method of claim 1, wherein the trench is defined by a third sidewall and a fourth sidewall facing each other along a third direction orthogonal to the first direction and the second direction, the method further comprising:
   forming a dielectric layer on the first sidewall, the second sidewall, the third sidewall, and the fourth sidewall, prior to forming the first epitaxial layer and the second epitaxial layer; and
   removing a first portion of the dielectric layer on the first sidewall, and a second portion of the dielectric layer on the second sidewall.

5. The method of claim 4, wherein removing the first portion of the dielectric layer on the first sidewall, and the second portion of the dielectric layer on the second sidewall includes:
   covering a third portion of the dielectric layer on the third sidewall, and a fourth portion of the dielectric layer on the fourth sidewall with a photoresist mask, while exposing the first portion and the second portion of the dielectric layer; and
   etching the first portion and the second portion of the dielectric layer.

6. The method of claim 1, further comprising:
   removing portions of the first epitaxial layer, the second epitaxial layer, the third epitaxial layer, and the fourth epitaxial layer formed above a surface of the substrate.

7. The method of claim 1, further comprising:
   removing the first and second epitaxial layers.

8. The method of claim 1, further comprising:
   forming a first source/drain structure between the first sidewall and the third epitaxial layer.

9. The method of claim 8, further comprising:
   forming a gate dielectric region on the third epitaxial layer along the second direction, after forming the first source/drain structure.

10. The method of claim 9, further comprising:
    forming a first spacer above the first source/drain structure along the second direction between the first sidewall and the third epitaxial layer.

11. The method of claim 10, further comprising:
    forming a gate structure above the first spacer along the second direction between the first sidewall and the third epitaxial layer, the gate dielectric region formed between the gate structure and the third epitaxial layer.

12. The method of claim 11, further comprising:
    forming a second spacer above the gate structure along the second direction between the first sidewall and the third epitaxial layer.

13. The method of claim 12, further comprising:
    removing an exposed portion of the gate dielectric region after depositing the second spacer; and
    forming a second source/drain structure above the second spacer along the second direction between the first sidewall and the third epitaxial layer,
    wherein a first end of the gate dielectric region directly contacts the first source/drain structure, and a second end of the gate dielectric region directly contacts the second source/drain structure.

14. The method of claim 1, further comprising:
    forming a first set of epitaxial layers of the first type and a second set of epitaxial layers of the second type between the first sidewall and the second sidewall, each of the second set of epitaxial layers of the second type interposed between two corresponding epitaxial layers of the first type; and
    forming a third set of epitaxial layers of the first type and a fourth set of epitaxial layers of the second type between the first sidewall and the second sidewall, each of the fourth set of epitaxial layers of the second type interposed between two corresponding epitaxial layers of the first type.

15. The method of claim 14, further comprising:
removing the first epitaxial layer, the second epitaxial layer, the first set of epitaxial layers, and the third set of epitaxial layers.

16. The method of claim 14, further comprising:
forming a divider between i) one of the first set of epitaxial layers closest to the second sidewall and ii) one of the third set of epitaxial layers closest to the first sidewall.

17. A device comprising:
a substrate including a trench defined by a first sidewall and a second sidewall facing each other along a first direction, and a floor between one end of the first sidewall and one end of the second sidewall;
one or more epitaxial layers in the trench, each of the one or more epitaxial layers extending along a second direction traversing the first direction, wherein the first sidewall, the second sidewall, the floor of the trench, and the one or more epitaxial layers define two or more slots within the trench;
a first set of source/drain structures in the two or more slots above the floor of the trench along the second direction;
a second set of source/drain structures in the two or more slots above the first set of source/drain structures along the second direction; and
a set of gate structures in the two or more slots, each of the set of gate structures between a corresponding one of the first set of source/drain structures and a corresponding one of the second set of source/drain structures.

18. The device of claim 17, further comprising:
gate dielectric regions, each of the gate dielectric regions on a portion of a corresponding epitaxial layer of the one or more epitaxial layers between a corresponding one of the first set of source/drain structures and a corresponding one of the second set of source/drain structures.

19. The device of claim 17, further comprising:
a first set of spacers, each of the first set of spacers between a corresponding one of the first set of source/drain structures and a corresponding one of the set of gate structures; and
a second set of spacers, each of the second set of spacers between a corresponding one of the second set of source/drain structures and a corresponding one of the set of gate structures.

20. A device comprising:
a substrate including a trench defined by a first sidewall and a second sidewall facing each other along a first direction, and a floor between one end of the first sidewall and one end of the second sidewall;
a first epitaxial layer on the first sidewall along a second direction traversing the first direction;
a second epitaxial layer on the second sidewall along the second direction, the first epitaxial layer and the second epitaxial layer being a first type;
a third epitaxial layer on the first epitaxial layer along the second direction; and
a fourth epitaxial layer on the second epitaxial layer along the second direction, the third epitaxial layer and the fourth epitaxial layer being a second type.

* * * * *